(12) United States Patent
Kimata et al.

(10) Patent No.: US 7,829,798 B2
(45) Date of Patent: Nov. 9, 2010

(54) ELECTRONIC CONTROL UNIT AND PROCESS OF PRODUCING THE SAME

(75) Inventors: Ryuichi Kimata, Wako (JP); Yoshinori Maekawa, Wako (JP); Keiichiro Bungo, Wako (JP)

(73) Assignee: Honda Motor Co., Ltd, Tokyo (JP)

( * ) Notice: Subject to any disclaimer, the term of this patent is extended or adjusted under 35 U.S.C. 154(b) by 303 days.

(21) Appl. No.: 11/921,272

(22) PCT Filed: Jun. 23, 2006

(86) PCT No.: PCT/JP2006/312612

§ 371 (c)(1),
(2), (4) Date: Jan. 15, 2008

(87) PCT Pub. No.: WO2006/137523

PCT Pub. Date: Dec. 28, 2006

(65) Prior Publication Data

US 2009/0101390 A1    Apr. 23, 2009

(30) Foreign Application Priority Data

Jun. 23, 2005  (JP) .............................. 2005-183609

(51) Int. Cl.
   *H01L 23/28* (2006.01)
(52) U.S. Cl. .................................. 174/521; 264/272.14
(58) Field of Classification Search ................. 174/521; 257/787, 788; 264/272.14
See application file for complete search history.

(56) References Cited

U.S. PATENT DOCUMENTS

| 6,259,157 | B1 | 7/2001 | Sakamoto et al. |
| 6,787,093 | B2 * | 9/2004 | Kiritani ...................... 264/511 |
| 6,989,121 | B2 * | 1/2006 | Thummel .............. 264/272.13 |
| 2001/0045686 | A1 * | 11/2001 | Thummel .............. 264/272.14 |
| 2004/0026106 | A1 * | 2/2004 | Peinsipp et al. ............. 174/521 |
| 2005/0000726 | A1 * | 1/2005 | Kimata et al. ............... 174/256 |

FOREIGN PATENT DOCUMENTS

| DE | 27 37 010 A1 | 3/1979 |
| DE | 196 11 407 A1 | 9/1996 |
| GB | 2 146 176 A1 | 4/1985 |
| JP | 2000-243768 A | 9/2000 |
| JP | 2004-363406 A | 12/2004 |

* cited by examiner

*Primary Examiner*—Hung V Ngo
(74) *Attorney, Agent, or Firm*—Arent Fox LLP

(57) ABSTRACT

An electronic control unit includes a printed wiring board (50), electronic components (51 to 53) mounted on the printed wiring board (50), and a synthetic resin coating (57) formed by injection molding to cover the printed wiring board (50) and the electronic component (51 to 53). The electronic components (51 to 53) are housed in a protective case (75) that can resist pressure and heat during the injection molding of the coating (57). Thus, in the electronic control unit, an electronic component is not damaged by formation of a coating by injection molding so that the electronic control unit can always function normally.

6 Claims, 20 Drawing Sheets

FIG.9
(A)
CHOKE VALVE FULLY CLOSED
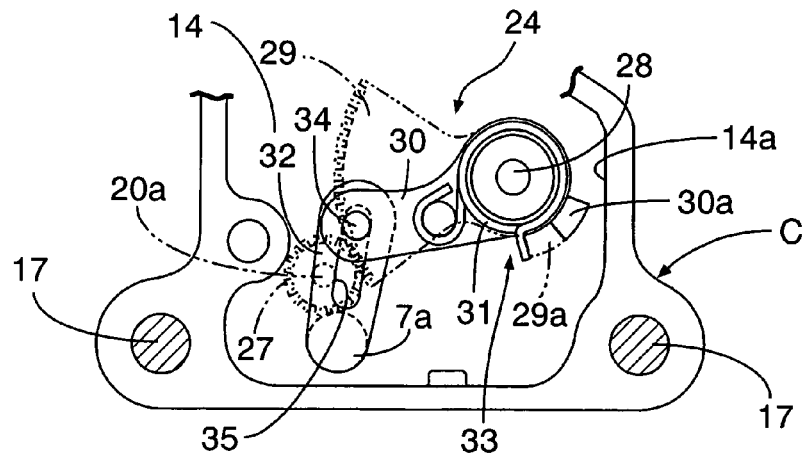
(B)
CHOKE VALVE FULLY CLOSED
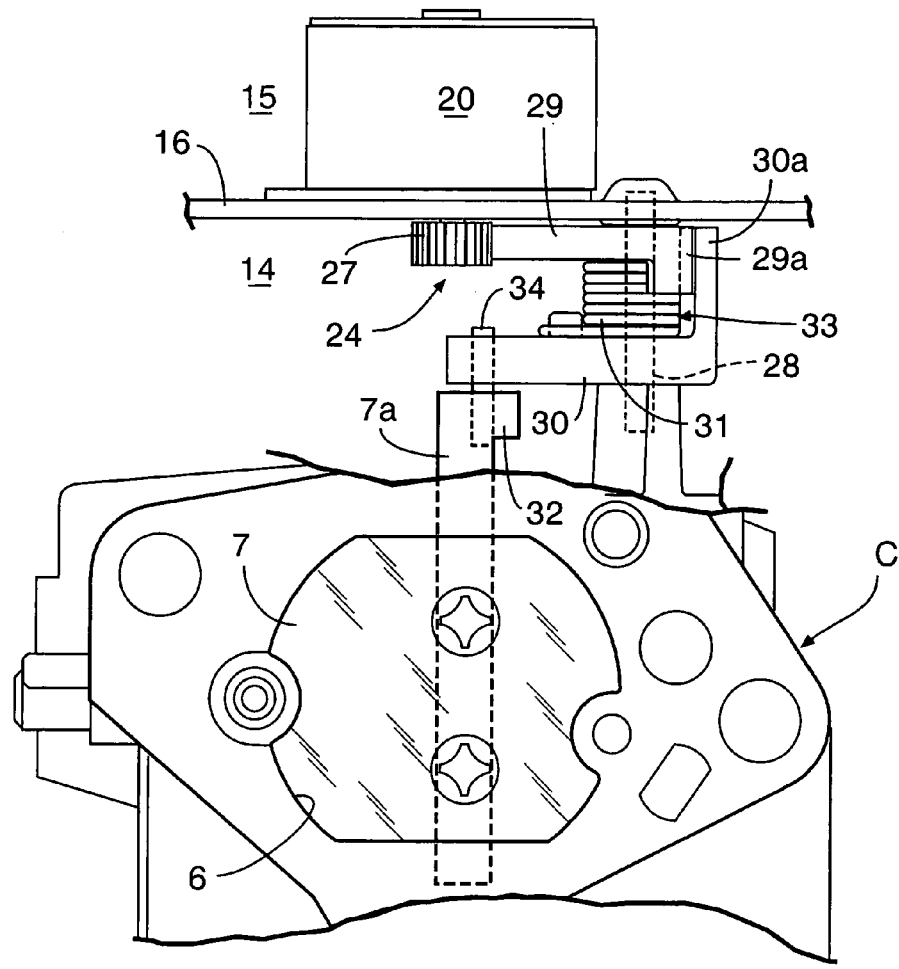

FIG.10
(A)
CHOKE VALVE FULLY OPENED
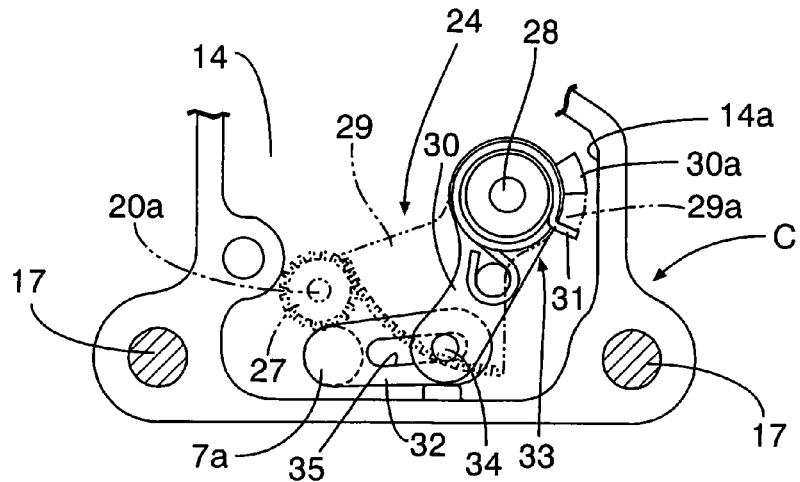
(B)
CHOKE VALVE FULLY OPENED
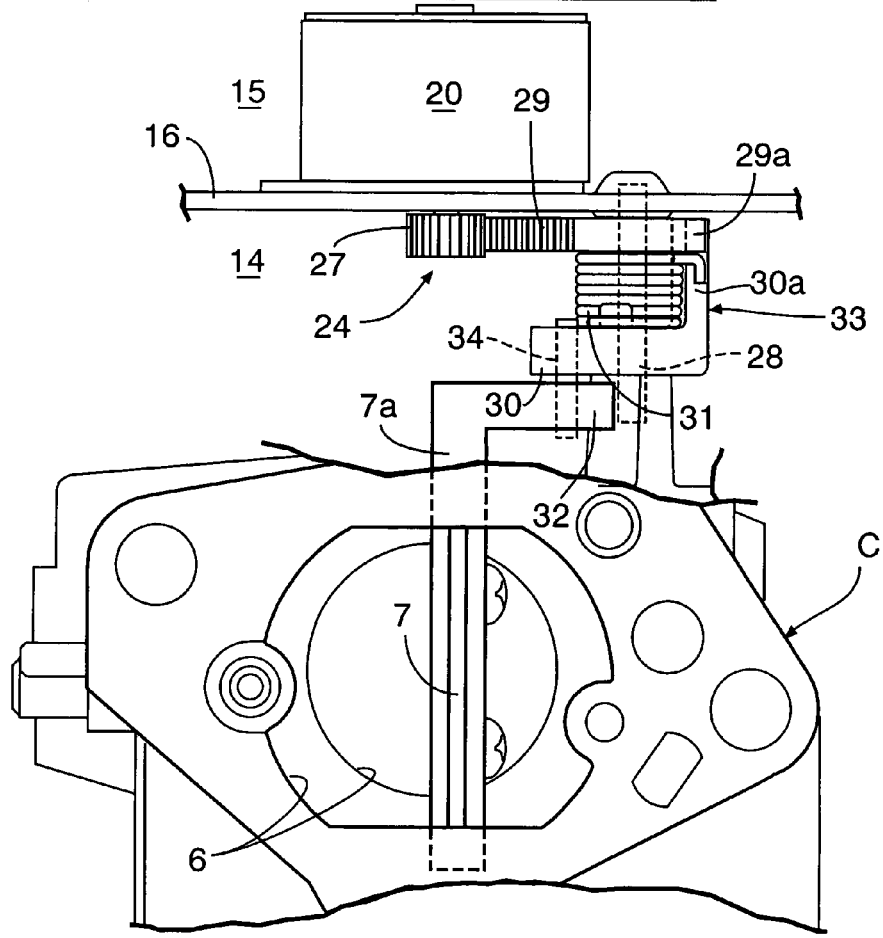

FIG.11
(A)
RELIEF OPENED VALVE
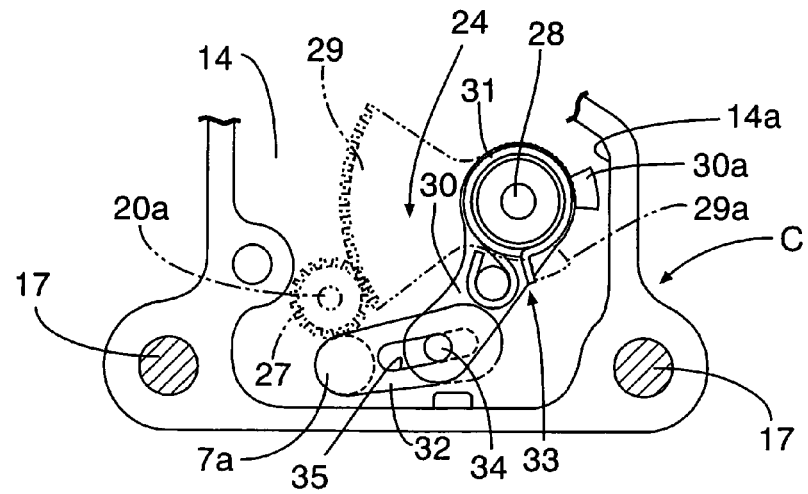
(B)
RELIEF OPENED VALVE
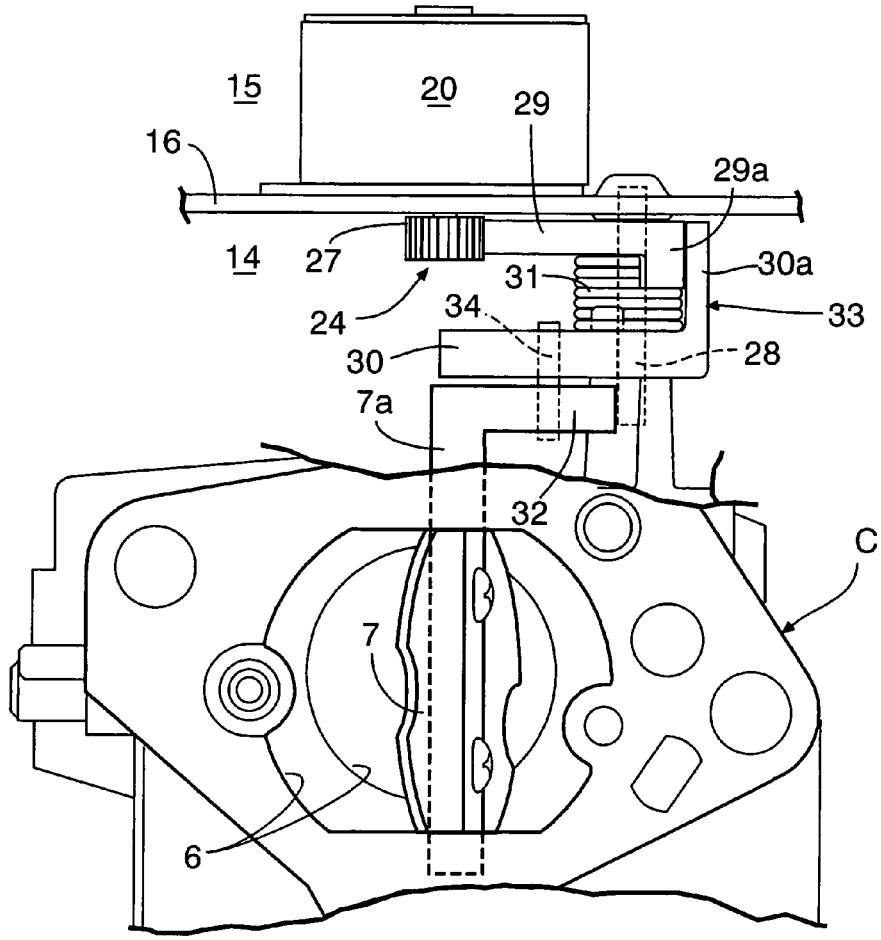

FIG.12
(A)
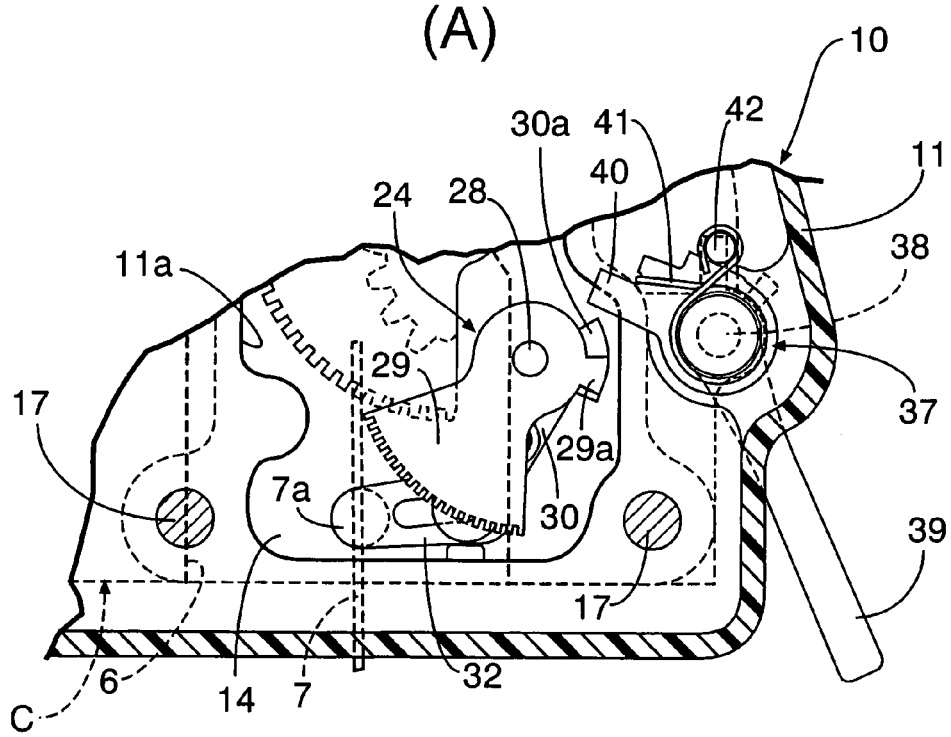
(B)
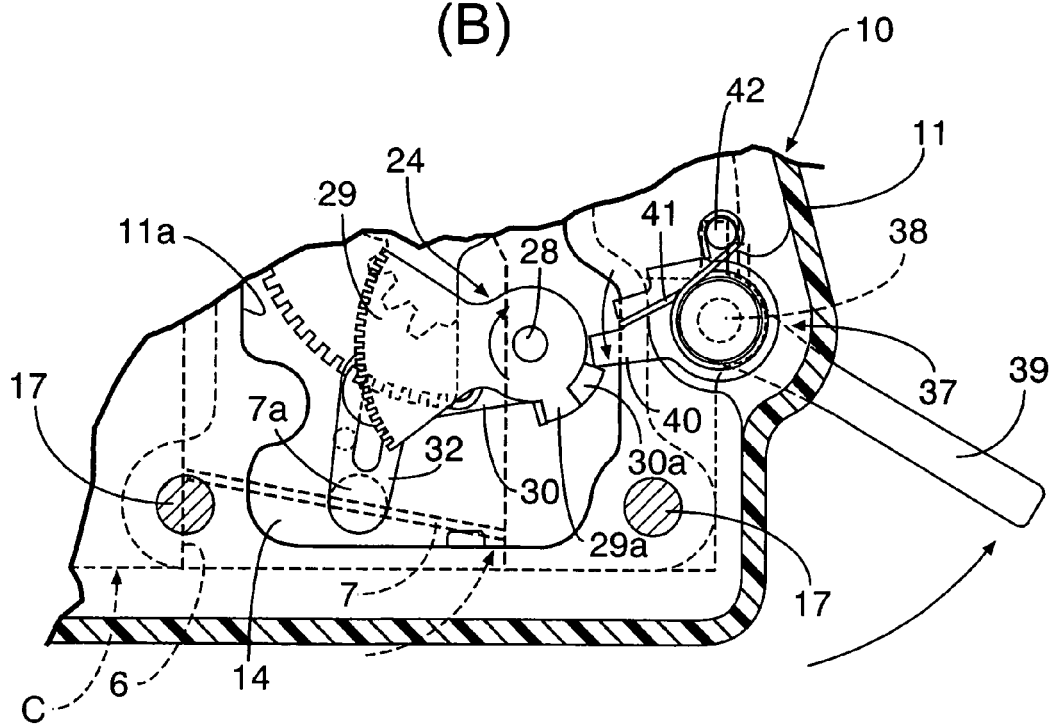

LEVER RATIO BETWEEN RELIEF LEVER AND CHOKE LEVER
(TORQUE ON CHOKE VALVE SHAFT)

ELECTRONIC CONTROL UNIT AND PROCESS OF PRODUCING THE SAME

CROSS-REFERENCE TO RELATED APPLICATION

This application is a National Stage entry of International Application No. PCT/JP2006/312612, filed Jun. 23, 2006, the entire specification claims and drawings of which are incorporated herewith by reference.

The present invention relates to an improvement of an electronic control unit comprising a printed wiring board, an electronic component mounted on the printed wiring board, and a synthetic resin coating formed by injection molding to cover the printed wiring board and the electronic component; and to an improvement of a process of producing the same.

BACKGROUND ART

Such an electronic control unit is known, as disclosed in Patent Publication 1. Patent Publication 1: Japanese Patent Application Laid-open No. 2004-363406

DISCLOSURE OF INVENTION

Problems to be Solved by the Invention

Such a conventional electronic control unit has a problem that the unit functioning normally before formation of the coating often functions abnormally after formation of the coating. The present inventors have found that the cause thereof lies in that the electronic component is broken by pressure or heat during injection molding of the coating.

The present invention has been accomplished under the above-mentioned circumstances, and it is an object thereof to provide an electronic control unit in which an electronic component is not damaged by formation of a coating by injection molding and which can always function normally, and a production process that is suitable for producing such an electronic control unit.

Means to Solve the Problems

In order to achieve the above object, according to a first feature of the present invention, there is provided an electronic control unit comprising a printed wiring board, an electronic component mounted on the printed wiring board, and a synthetic resin coating formed by injection molding to cover the printed wiring board and the electronic component, characterized in that the electronic component is housed in a protective case that can resist pressure and heat during the injection molding of the coating.

According to a second feature of the present invention, in addition to the first feature, the electronic component that is housed in the protective case is limited to one having a particularly large height among various types of electronic components mounted on the printed wiring board.

According to a third feature of the present invention, there is provided a process of producing the electronic control unit according to the first feature, the process comprising: a step of mounting on the printed wiring board the electronic component which is housed and held in the protective case; and a step of molding the coating by setting within a die the printed wiring board on which the electronic component is mounted, injecting a hot melt into a cavity having a uniform gap defined by the die around the printed wiring board and the electronic component, and filling the cavity with the hot melt.

Effects of the Invention

In accordance with the first feature of the present invention, the electronic component is covered by the protective case having excellent pressure resistance and heat resistance. Therefore, it is possible to protect the electronic component from pressure and heat during injection molding of the coating, thereby providing an electronic control unit in which the electronic component is free from any damage and which therefore has a high reliability.

In accordance with the second feature of the present invention, among various types of electronic components mounted on the printed wiring board, the electronic component housed in the protective case is limited to one having a particularly large height. This is because, a small electronic component having a small height is resistant to the influence of the pressure and heat of injection molding of the coating even without being housed in the protective case, leading no possibility of damage thereof. This can therefore contribute to a reduction in the cost of the electronic control unit by an amount corresponding to a part of the protective case that would otherwise have been used for the small electronic component.

In accordance with the third feature of the present invention, when molding the coating by injecting the hot melt into the cavity to be filled therewith, the protective case provides a shielding for protecting the electronic component from the injection pressure and heat. In particular, since the hot melt has a relatively low melting temperature and a high flowability, it is possible to reduce the influence of the injection pressure and heat on the protective case, thereby reliably protecting the electronic component. Further, since the coating formed on the printed wiring board and the electronic component has a uniform thickness, the entire coating is cooled uniformly, thereby avoiding distortion in the printed wiring board and other components. With this arrangement, there is provided an electronic control unit that always has a stable performance.

BRIEF DESCRIPTION OF DRAWINGS

FIG. 9 is a plan view (A) and a front view (B) of a first transmission system controlling a choke valve into a fully closed state (first embodiment).

FIG. 10 is a plan view (A) and a front view (B) of the first transmission system controlling the choke valve into a fully open state (first embodiment).

FIG. 11 is a plan view (A) and a front view (B) of the first transmission system showing an actuated state of a relief mechanism (first embodiment).

FIG. 12 is a plan view showing a non-actuated state (A) and an actuated state (B) of a choke valve forced closure mechanism in FIG. 7 (first embodiment).

Figure 1:
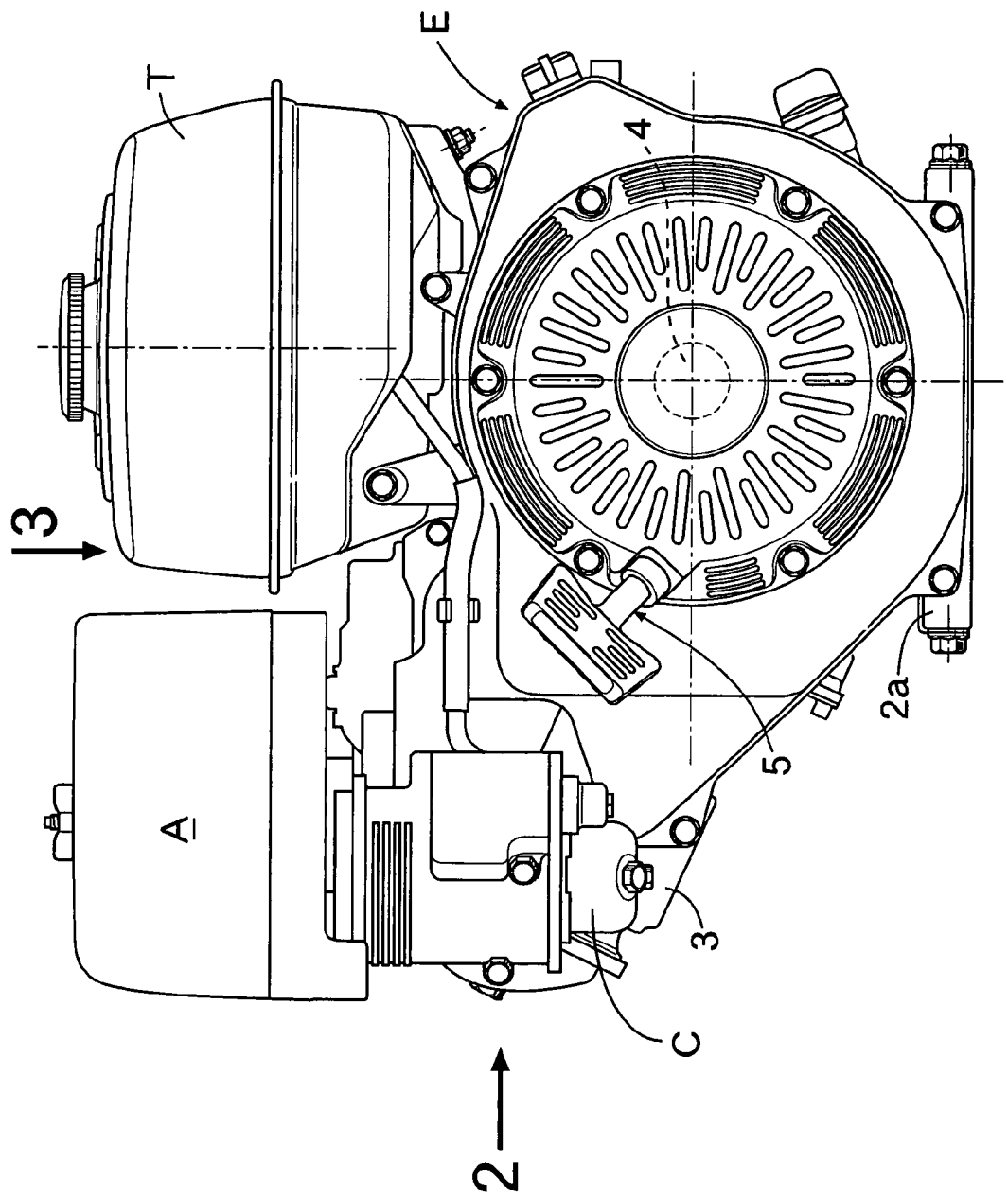
FIG. 1 is a front view of a general purpose engine related to an embodiment of the present invention (first embodiment).

EXPLANATION OF REFERENCE NUMERALS AND SYMBOLS 12a electronic control unit
50 printed wiring board
51 to 54 various types of electronic components
51 to 53 large electronic components
57 coating
75 protective case
80, 81 die (fixed and movable die halves)
82 cavity

BEST MODE FOR CARRYING OUT THE INVENTION

Mode for carrying out the present invention is described by reference to A preferred embodiment of the present invention shown in the attached drawings.

Embodiment 1

Figure 2:
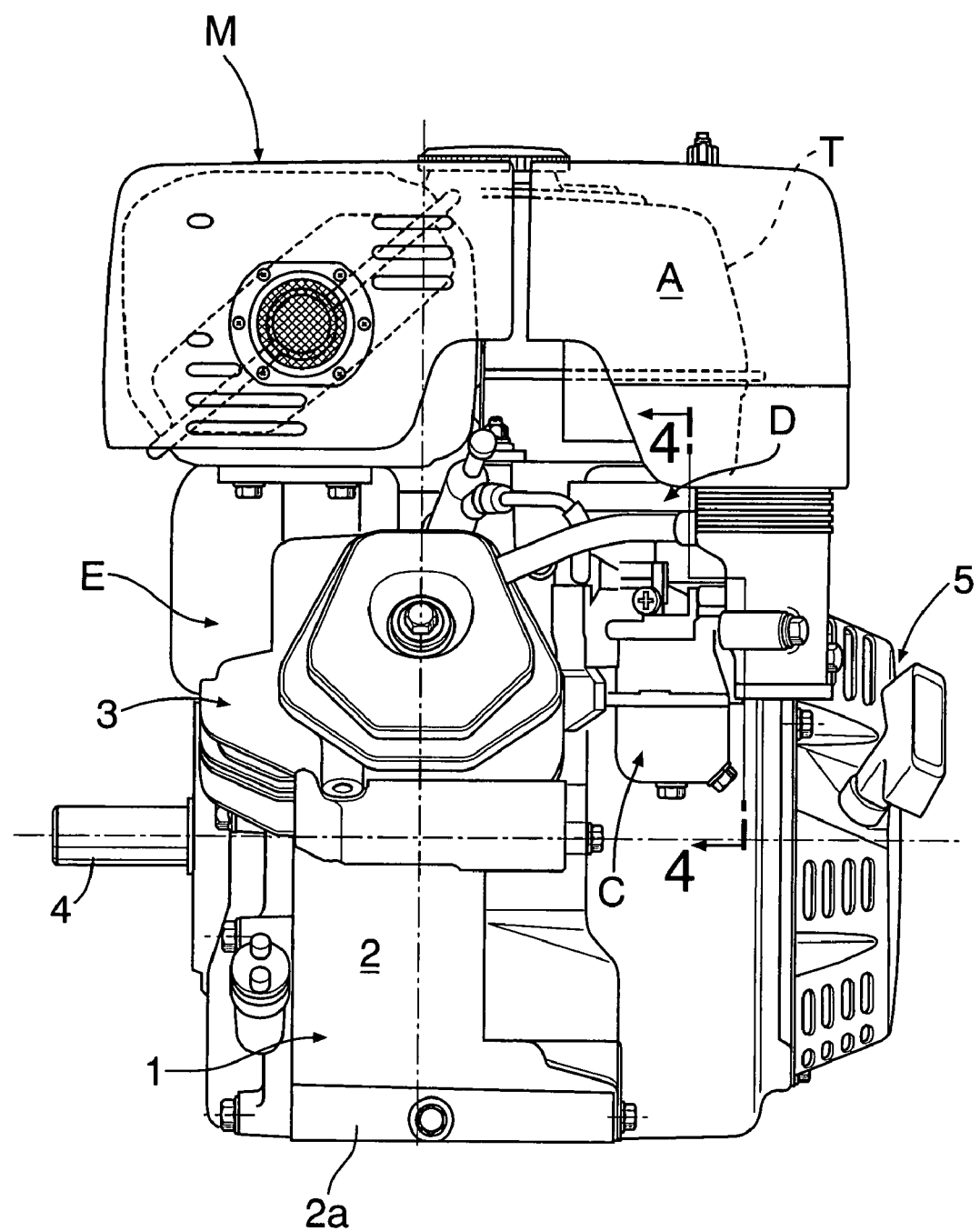
FIG. 2 is a view from arrow 2 in FIG. 1 (first embodiment).
Figure 3:
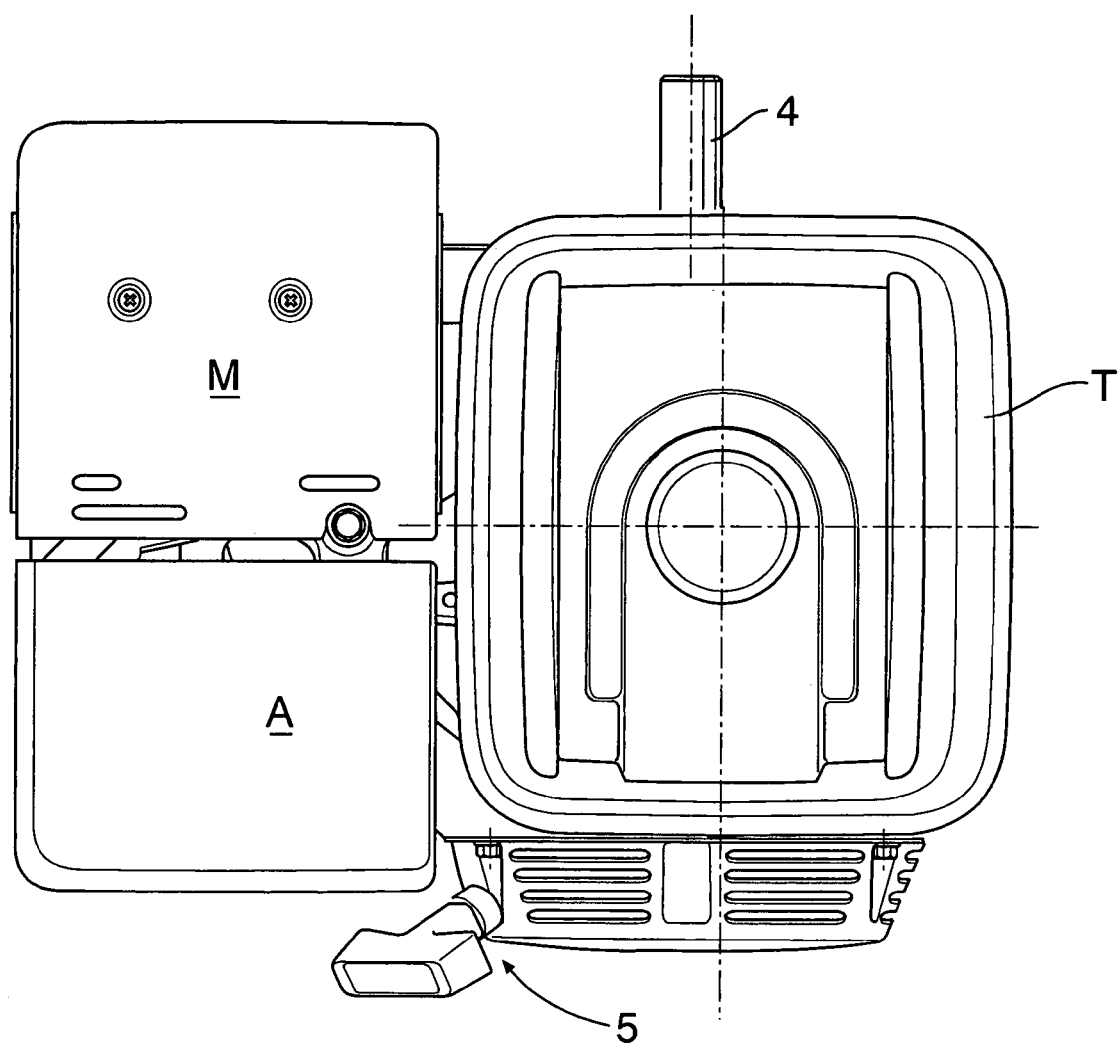
FIG. 3 is a view from arrow 3 in FIG. 1 (first embodiment).

Firstly, as shown in FIG. 1 to FIG. 3, an engine main body 1 of a general purpose engine E includes: a crank case 2 having a mounting flange 2a on a lower face thereof and horizontally supporting a crank shaft 4; and a cylinder 3 projecting obliquely upward on one side from the crank case 2. A recoil type engine starter 5 for cranking the crank shaft 4 is mounted on a front side of the crank case 2. Mounted on the engine main body 1 are a fuel tank T disposed above the crank case 2, and an air cleaner A and an exhaust muffler M adjoining the fuel tank T above the cylinder 3. Attached to one side of a head part of the cylinder 3 is a carburetor C for supplying into the cylinder 3 an air-fuel mixture formed by taking in air through the air cleaner A.

Figure 4:
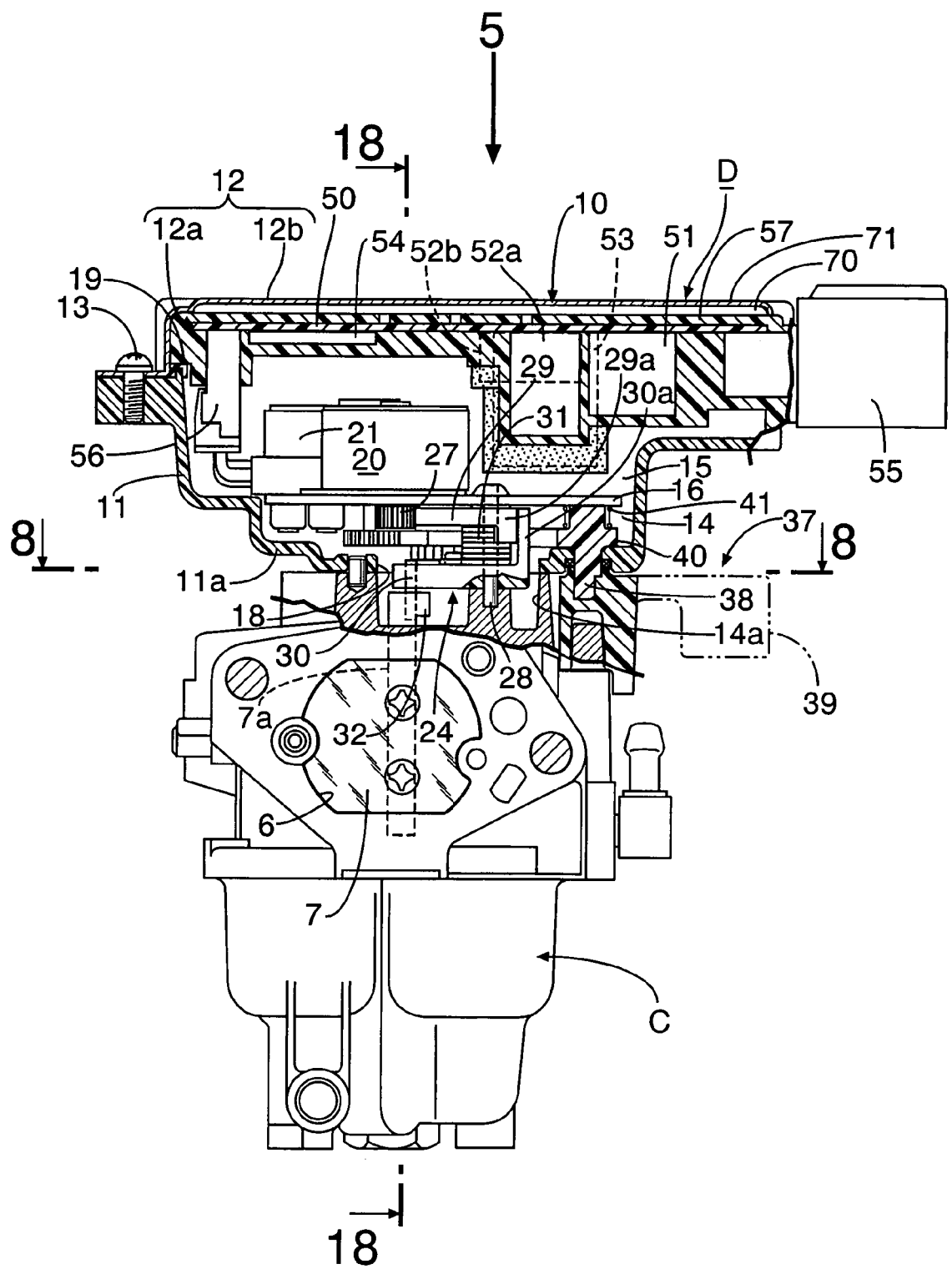
FIG. 4 is a sectional view along line 4-4 in FIG. 2 (first embodiment).
Figure 8:
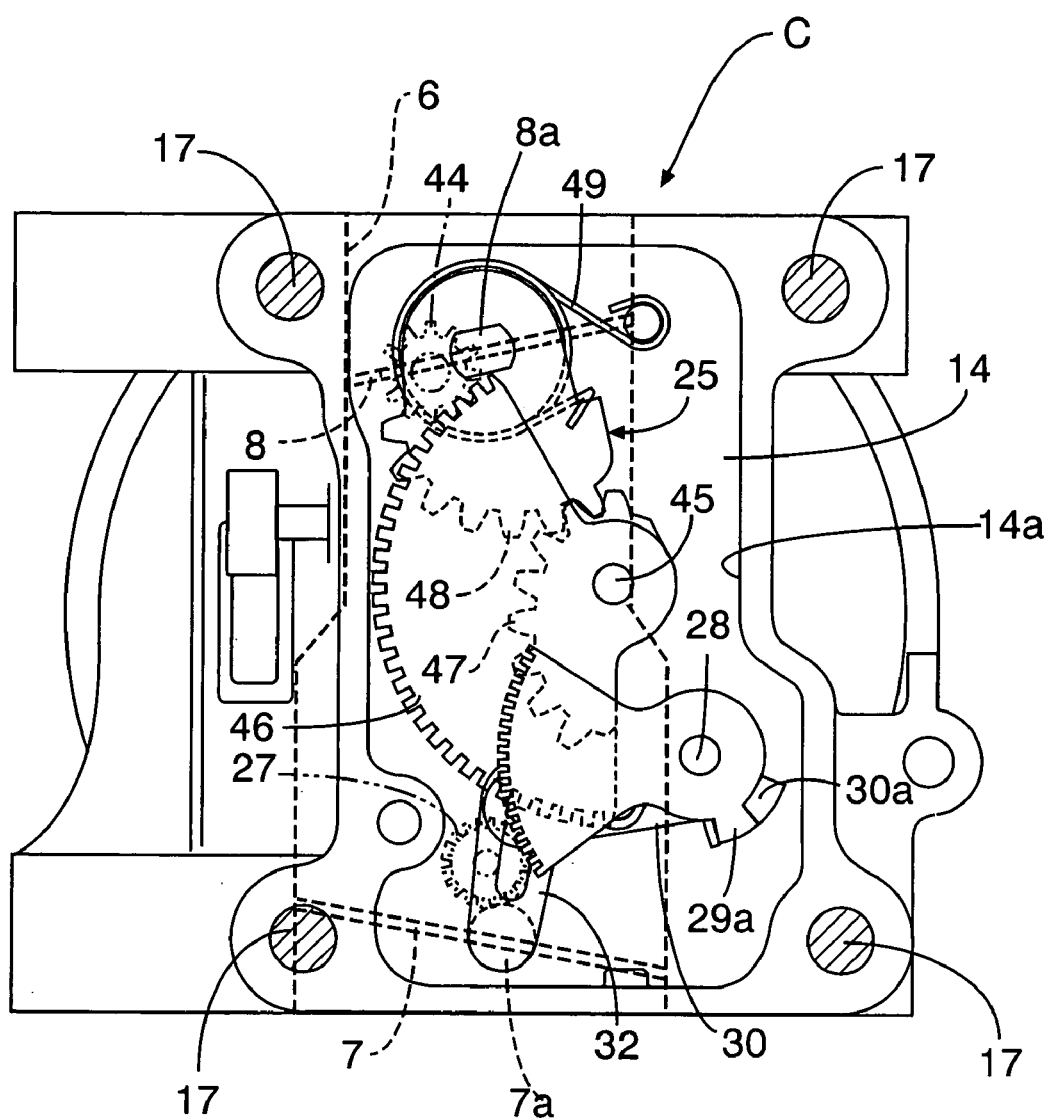
FIG. 8 is a sectional view along line 8-8 in FIG. 4 (first embodiment).

As shown in FIG. 4 and FIG. 8, the carburetor C has an intake path 6 communicating with an intake port of the head part of the cylinder 3. In the intake path 6, sequentially from the upstream side, that is, from the air cleaner A side, a choke valve 7 and a throttle valve 8 are disposed. A fuel nozzle (not illustrated) opens in a venturi part of the intake path 6 in a middle section between the two valves 7 and 8. Both the choke valve 7 and the throttle valve 8 are of a butterfly type, in which they are opened and closed by pivoting of valve shafts 7a and 8a. An electronic control system D for automatically controlling the degree of opening of the choke valve 7 and the throttle valve 8 is mounted above the carburetor C. Hereinafter, the valve shaft 7a of the choke valve 7 is called a choke valve shaft 7a, and the valve shaft 8a of the throttle valve 8 is called a throttle valve shaft 8a.

The electronic control system D is described by reference to FIG. 4 to FIG. 15.

Figure 5:
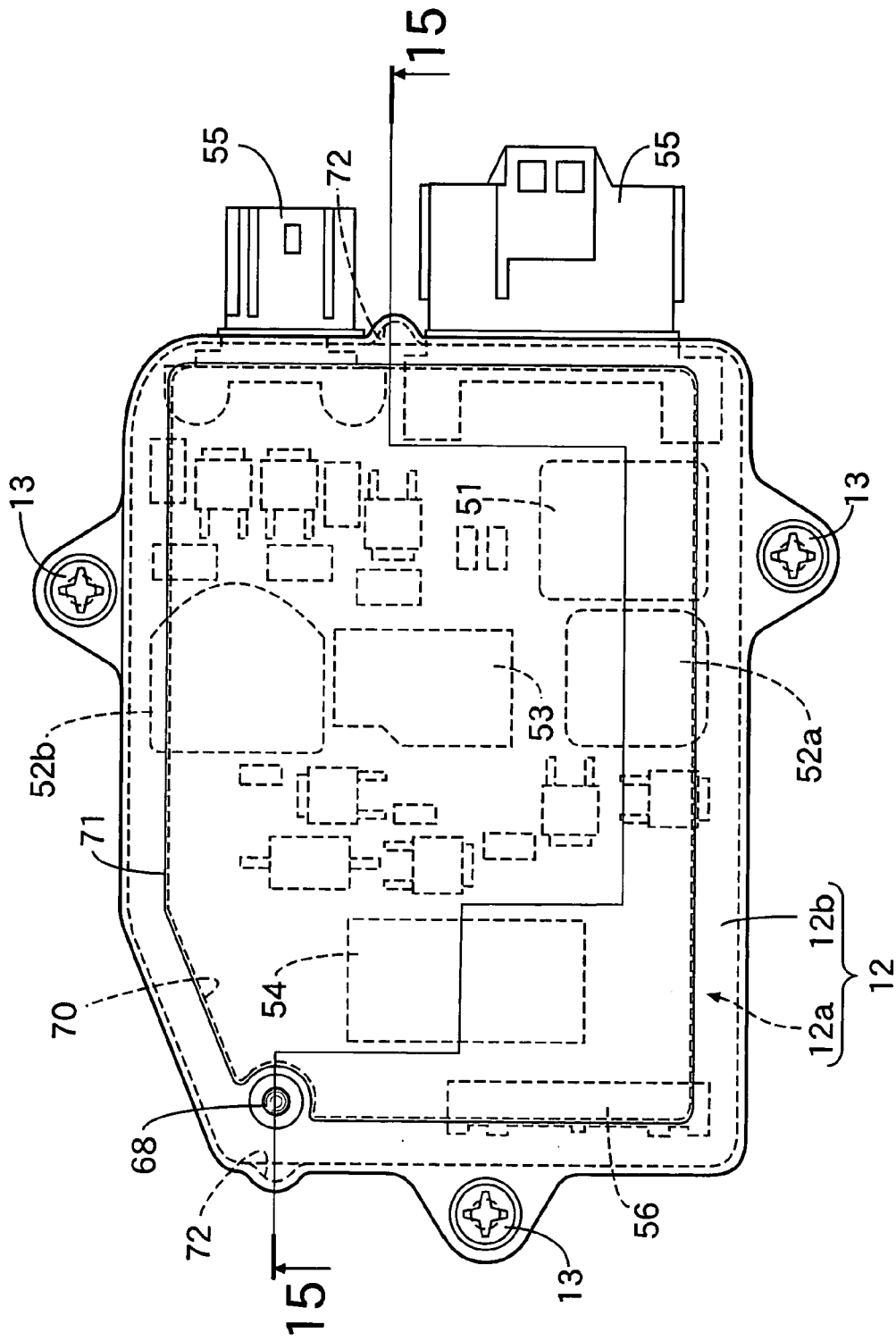
FIG. 5 is a view from arrow 5 in FIG. 4 (plan view of an electronic control system) (first embodiment).

Firstly, in FIG. 4 and FIG. 5, a casing 10 of the electronic control system D: a casing main body 11 having a base wall 11a joined to an upper end face of the carburetor C; and a lid 12 joined to the casing main body 11 so as to close an open face thereof. The lid body 12 comprises: a flat box-shaped cover 12b made of a steel plate joined to the casing main body 11 by a bolt 13 so as to close its open end face; and an electronic control unit 12a fitted into the inside of the cover 12b, and held between the cover 12b and the casing main body 11. An endless seal 19 is fitted onto an inner peripheral edge of the open end face of the casing main body 11, the seal 19 being in intimate contact with a lower face of an outer peripheral part of the electronic control unit 12a.

Figure 15:
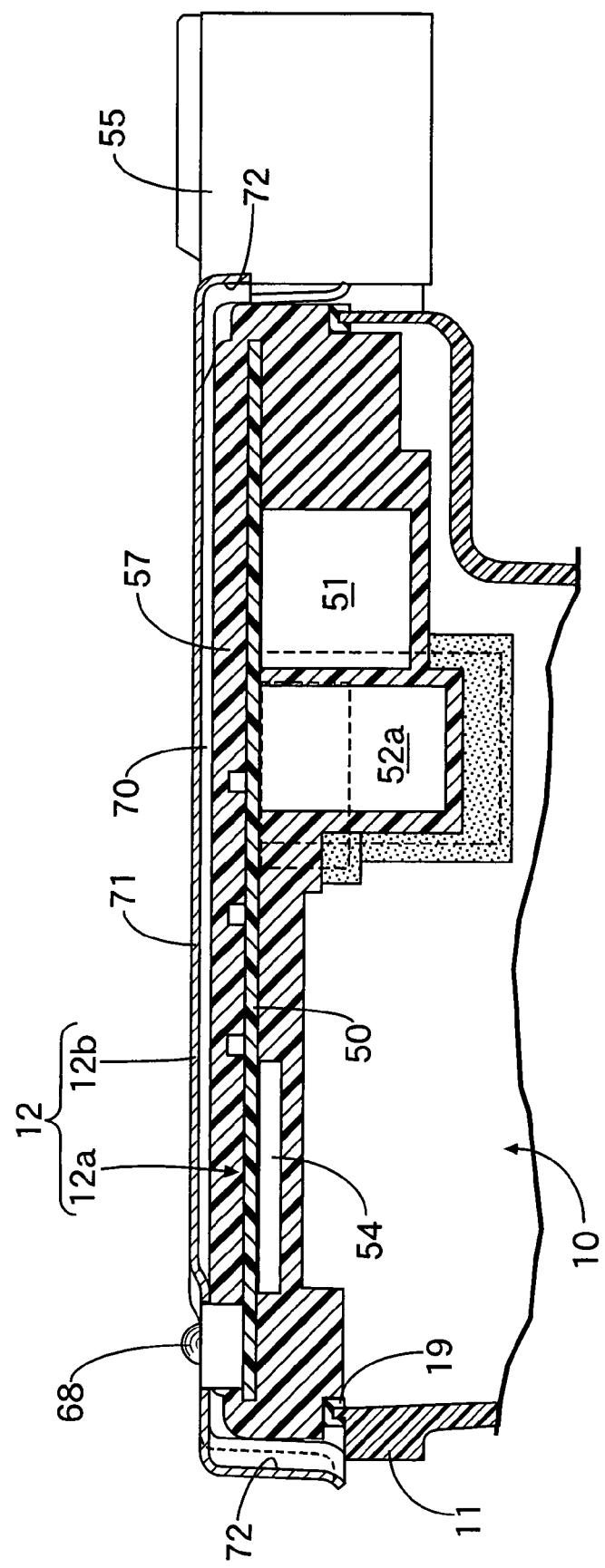
FIG. 15 is a sectional view along line 15-15 in FIG. 5 (first embodiment).

As shown in FIG. 4 and FIG. 15, a bulging part 71 causing its portion other than its peripheral portion to bulge outwardly is formed on the cover 12b, to form a gap 70 between itself and the electronic control unit 12a. An air passage 72 providing communication between the gap 70 and the open end of the cover 12b is provided between the electronic control unit 12a and the cover 12b. The air passage 72 is bent into a hook shape and has its outer end facing downward so as to be open to the atmosphere.

Figure 6:
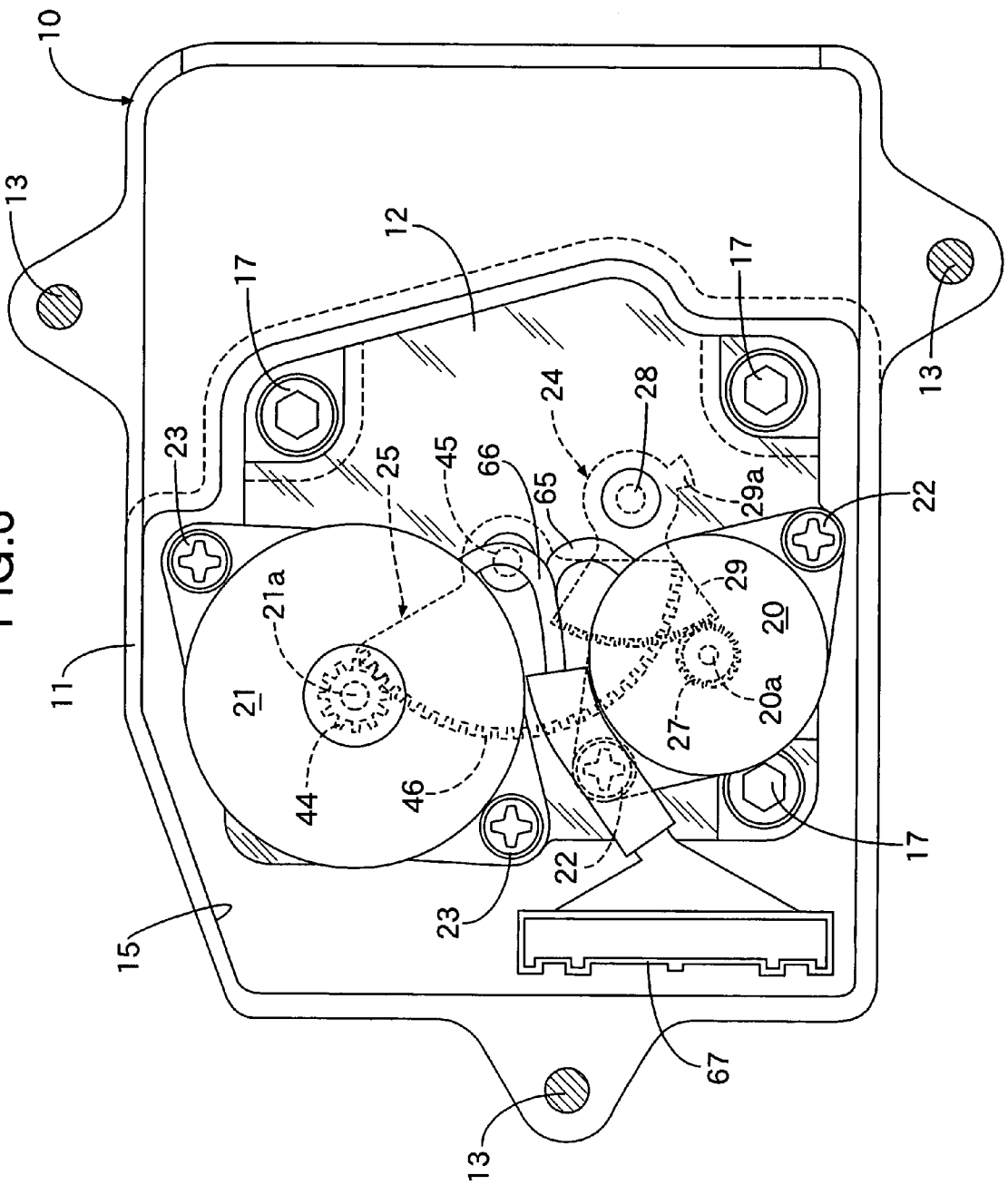
FIG. 6 is a plan view showing a state in which the electronic control system has its lid body removed (first embodiment).
Figure 7:
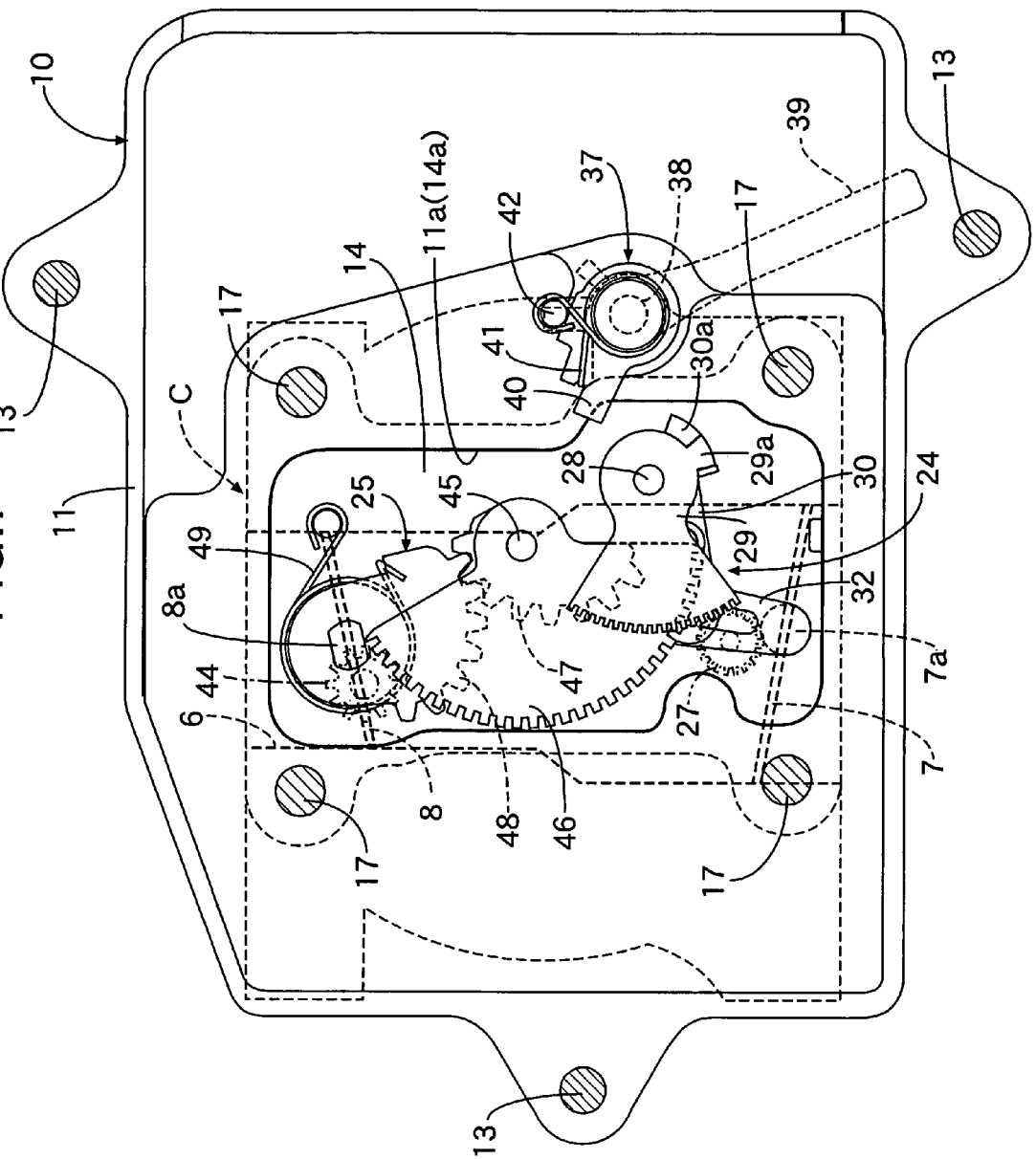
FIG. 7 is a plan view showing a state in which the electronic control system has its lid body and partition plate removed (first embodiment).

As shown in FIG. 4, FIG. 6, and FIG. 7, a partition plate 16 is provided within the casing main body 11 to divide the interior of the casing 10 into a transmission chamber 14 on the base wall 11a side and a drive chamber 15 on the lid 12 side, the partition 16 being a separate body from the casing main body 11. The partition plate 16 is secured to the carburetor C together with the base wall 11a by a plurality of bolts 17.

An opening 18 is provided in the base wall 11a of the casing main body 11. A depression 14a corresponding to the opening 18 is provided on the upper end face of the carburetor C. The depression 14a acts as part of the transmission chamber 14. Outer end parts of the choke valve shaft 7a and the throttle valve shaft 8a are arranged so as to face the depression 14a.

A first electric motor 20 and a second electric motor 21 are mounted on the partition plate 16 by screws 22 and 23 respectively in the drive chamber 15. Disposed in the transmission chamber 14 are a first transmission device 24 for transmitting an output torque of the first electric motor 20 to the choke valve shaft 7a, and a second transmission device 25 for transmitting a driving force of the second electric motor 21 to the throttle valve shaft 8a. In this way, the first and second electric motors 20 and 21 and the first and second transmission devices 24 and 25 are housed in the casing 10 and protected.

As shown in FIG. 7 to FIG. 9, the first transmission device 24 includes: a first pinion 27 secured to an output shaft 20a of the first electric motor 20; a first sector gear 29 that is rotatably supported on a first support shaft 28 having opposite end parts thereof supported on the partition plate 16 and the carburetor C and that meshes with the first pinion 27; a relief lever 30 supported on the first support shaft 28 while being relatively rotatably superimposed on the first sector gear 29; and a choke lever 32 formed integrally with the outer end part of the choke valve shaft 7a and joined to the relief lever 30. Formed on the first sector gear 29 and the relief lever 30 respectively are abutment pieces 29a and 30a that abut against each other and transmit to the relief lever 30 a driving force of the first sector gear 29 in a direction that opens the choke valve 7. A relief spring 31, which is a torsional coil spring, is mounted around the first support shaft 28. With a fixed set load, the relief spring 31 urges the first sector gear 29 and the relief lever 30 in a direction that makes the abutment pieces 29a and 30a abut against each other.

As clearly shown in FIG. 9, the structure linking the relief lever 30 and the choke lever 32 to each other is established by slidably engaging a connecting pin 34 projectingly provided on a side face at an extremity of the relief lever 30 with an oblong hole 35 that is provided in the choke lever 32 and that extends in the longitudinal direction of the lever 32.

The output torque of the first electric motor 20 is thus reduced and transmitted from the first pinion 27 to the first sector gear 29. Since the first sector gear 29 and the relief lever 30 are usually coupled via the abutment pieces 29a, 30a and the relief spring 31 to integrally pivot, the output torque of the first electric motor 20 transmitted to the first sector gear 29 can be transmitted from the relief lever 30 to the choke lever 32 and the choke valve shaft 7a, thus enabling the choke valve 7 to be opened and closed.

As shown in FIG. 8, the choke valve shaft 7a is positioned offset to one side from the center of the intake path 6, and the choke valve 7 is inclined relative to the central axis of the intake path 6 so that, in a fully closed state, a side of the choke valve 7 that has a larger rotational radius is on the downstream side of the intake path 6 relative to a side thereof that has a smaller rotational radius. Therefore, while the first electric motor 20 is operated so that the choke valve 7 is fully closed or held at a very small opening-degree, if the intake negative pressure of the engine E exceeds a predetermined value, the choke valve 7 can be opened regardless of the operation of the first electric motor 20, to a point at which the difference between the rotational moment due to the intake negative pressure imposed on the side of the choke valve 7 that has the larger rotational radius and the rotational moment due to the intake negative pressure imposed on the side of the choke valve 7 that has the smaller rotational radius, balances the rotational moment due to the relief spring 31 (see FIG. 11). The relief lever 30 and the relief spring 31 thus form a relief mechanism 33. The relief lever 30 and relief spring 31 are supported on the first support shaft 28, and are therefore positioned so as to be offset from the top of the output shaft 20a of the first electric motor 20 and the top of the choke valve shaft 7a.

Figure 14:
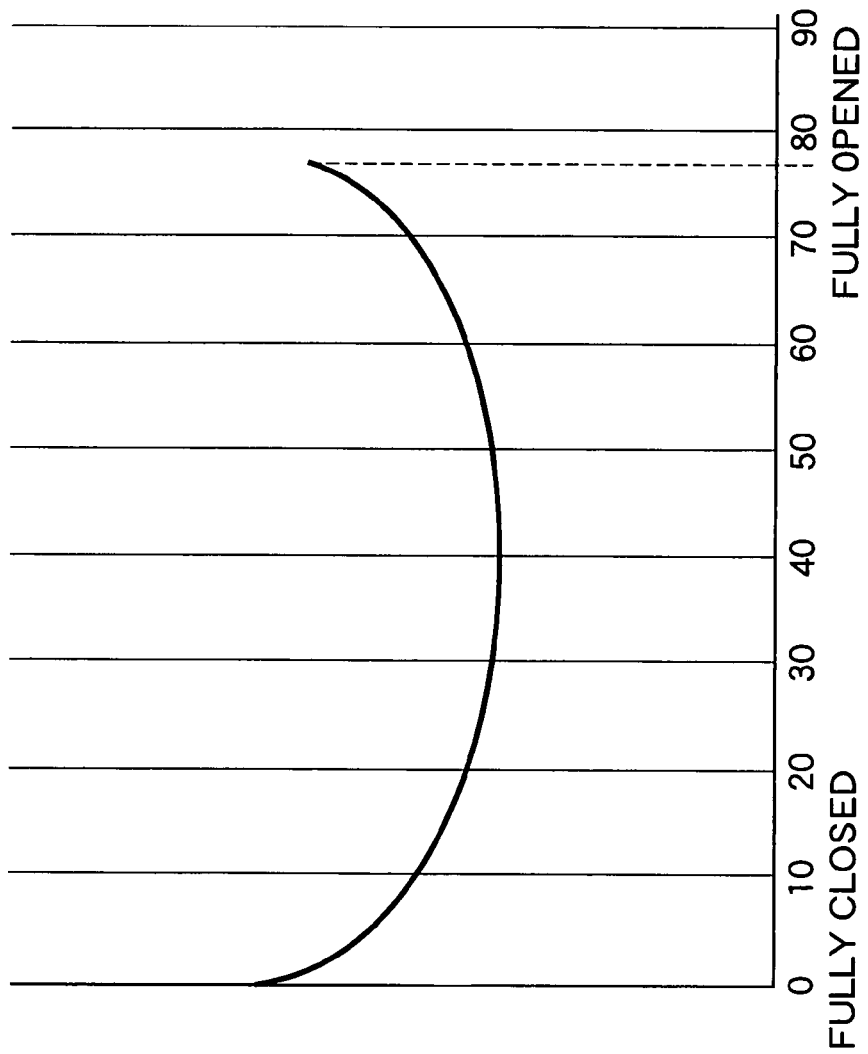
FIG. 14 is a graph showing the relationship between the opening degree of the choke valve, and the lever ratio between a relief lever and a choke lever (first embodiment).

As shown in FIG. 9 and FIG. 10, the relief lever 30 and the choke lever 32 are arranged at an exactly or approximately right angle when the choke valve 7 is in a fully opened position and in a fully closed position, and the connecting pin 34 is positioned at the end of the oblong hole 35 that is farther from the choke valve shaft 7a. When the choke valve 7 is at a predetermined medium opening-degree, the relief lever 30 and the choke lever 32 are arranged in a straight line, and the connecting pin 34 is positioned at the other end of the long hole 35 that is closer to the choke valve shaft 7a. Therefore, the effective arm length of the choke lever 32 becomes a maximum when the choke valve 7 is in fully opened and fully closed positions, and becomes a minimum when the choke valve 7 is at the predetermined medium opening-degree. As a result, the lever ratio between the relief lever 30 and the choke lever 32 changes, as shown in FIG. 14, such that it becomes a maximum when the choke valve 7 is in fully opened and fully closed positions and becomes a minimum when the choke valve 7 is at the predetermined medium opening-degree.

Even if the first electric motor 20 becomes inoperable when the choke valve 7 is in the fully opened state due to, for example, an insufficient amount of electricity stored in a battery 60 (FIG. 13) which will be described later, the engine E can be started because a choke valve forced closure mechanism 37 that forcibly closes the choke valve 7 is provided to adjoin one side of the relief lever 30.

As shown in FIG. 4, FIG. 7, and FIG. 12, the choke valve forced closure mechanism 37 includes: a lever shaft 38 having opposite end parts rotatably supported on the base wall 11a of the casing main body 11 and the carburetor C; an operating lever 39 coupled to the lever shaft 38 and disposed beneath the casing main body 11; an actuating arm 40 formed integrally with the lever shaft 38 and facing one side of the abutment piece 30a of the relief lever 30; and a return spring 41 which is a torsional coil spring and is connected to the actuating arm 40 so as to urge the actuating arm 40 in a direction that detaches it from the abutment piece 30a, that is, in a retraction direction. When the choke valve 7 is fully opened, by making the operating lever 39 pivot against the urging force of the return spring 41, the actuating arm 40 pushes the abutment piece 30a of the relief lever 30 in a direction that closes the choke valve 7.

The retraction position of the operating lever 39 and the actuating arm 40, which are connected integrally to each other, is restricted by one side of the actuating arm 40 abutting against a retaining pin 42 provided in the casing main body 11 so as to retain the fixed end of the return spring 41. The operating lever 39 is usually positioned so that it is not accidentally hit by any other objects, for example, in such a manner that the extremity of the operating lever 39 faces the engine E side. With this arrangement, erroneous operation of the operating lever 39 can be avoided.

The second transmission device 25 is now described by reference to FIG. 4, FIG. 6, and FIG. 7.

The second transmission device 25 includes: a second pinion 44 secured to the output shaft 21a of the second electric motor 21; a second sector gear 46 that is rotatably supported on a second support shaft 45 having opposite end parts supported on the partition plate 16 and the carburetor C and that meshes with the second pinion 44; a non-constant speed drive gear 47 integrally molded with one side of the second sector gear 46 in the axial direction; and a non-constant speed driven gear 48 secured to an outer end part of the throttle valve shaft 8a and meshing with the non-constant speed drive gear 47. Connected to the non-constant speed driven gear 48 is a throttle valve closing spring 49 that urges the non-constant speed driven gear 48 in a direction that closes the throttle valve 8. By employing part of an elliptic gear or an eccentric gear, both the non-constant-speed drive and driven gears 47 and 48 are designed so that the gear ratio, that is, the reduction ratio between them decreases in response to an increase in the degree of opening of the throttle valve 8. Therefore, the reduction ratio is a maximum when the throttle valve 8 is in a fully closed state. With this arrangement, it becomes possible to minutely control the degree of opening in a low opening-degree region, which includes an idle opening-degree of the throttle valve 8, by operation of the second electric motor 21.

The first and second support shafts 28 and 45, which are components of the first and second transmission devices 24 and 25, are supported by opposite end parts thereof being fitted into the carburetor C and the partition plate 16, and serves as positioning pins for positioning the partition plate 16 at a fixed position relative to the carburetor C. Therefore, it is unnecessary to employ a positioning pin used exclusively for this purpose, thereby contributing to a reduction in the number of components. With this positioning of the partition plate 16, it is possible to appropriately couple the first transmission device 24 to the choke valve shaft 7a, and couple the second transmission device 25 to the throttle valve 8. Moreover, since the first and second electric motors 20 and 21 are mounted on the partition plate 16, it is possible to appropriately couple the first electric motor 20 to the first transmission device 24, and couple the second electric motor 21 to the second transmission device 25.

Figure 18:
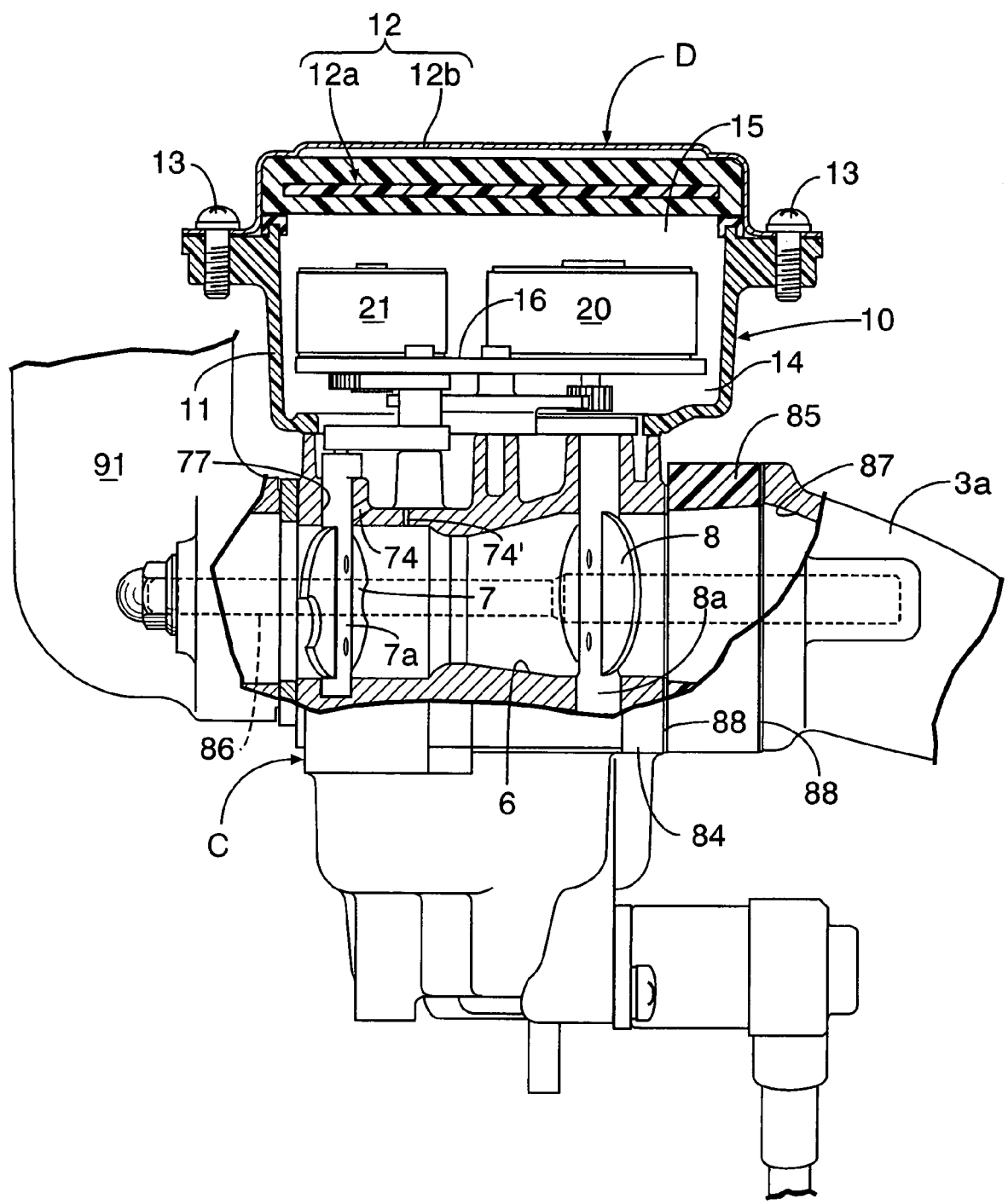
FIG. 18 is a sectional view along line 18-18 in FIG. 4 (first embodiment).

As shown in FIG. 18, provided in the carburetor C is an air passage structure of the interior of the casing 10, that is, the transmission chamber 14 and the drive chamber 15 which communicate with each other. This air passage structure comprises a vent 74 or 74' that is bored in an upper side wall of the carburetor C and that provides communication between a base part of the interior of the casing 10 and the intake path 6. The vent 74 is provided so as to open in the intake path 6 via a bearing hole 77 rotatably supporting the choke valve shaft 7a. The vent 74' is provided so as to open directly in the intake path 6.

The electronic control unit 12a is now described by reference to FIG. 4, FIG. 5, and FIG. 13.

As shown in FIG. 4 and FIG. 5, the electronic control unit 12a is formed by mounting various types of electronic components 51 to 54 on an electric circuit of a substantially rectangular printed wiring board 50, and connecting an input connector 55 and an output connector 56 to longitudinally opposite ends of the board 50. The board 50 is positioned parallel to the base wall 11a of the casing main body 11. Mounted on an inside face of the board 50 facing the drive chamber 15 are, for example, tall large electronic components such as a transformer 51, capacitors 52a and 52b, and a heatsink 53, as well as thin low-profile electronic components such as a CPU 54. A pilot lamp 68 is mounted on an outside face of the board 50. The large electronic components 51 to 53 and the low-profile electronic component 54 are thus contained within the drive chamber 15, the large electronic components 51 to 53 being positioned in the vicinity of the partition plate 16 on one side of the drive chamber 15, and the low-profile electronic component 54 being positioned on the other side of the drive chamber 15. The first and second electric motors 20 and 21 are positioned in the vicinity of the board 50 and the low-profile electronic component 54 on said other side of the drive chamber 15. In this way, the first and second electric motors 20, 21 and the large electronic components 51 to 53 are arranged in a staggered manner.

With this staggered arrangement, the first and second electric motors 20, 21 and the large electronic components 51 to 53 can be efficiently housed in the drive chamber 15. Therefore, the dead space in the drive chamber 15 can be greatly reduced and the volume of the drive chamber 15 can be made smaller, thereby reducing the size of the casing 10 and consequently making compact the entire engine E including the carburetor C equipped with the electronic control system D.

In order to seal the printed wiring board 50 mounting thereon the various types of electronic components 51 to 54, a synthetic resin coating 57 for covering these components is formed. This coating 57 is formed to have a substantially uniform thickness along the shapes of the printed wiring board 50 and the various types of electronic components 51 to 54.

A light-emitting part of the pilot lamp 68 (FIG. 5) is positioned so as to run through the coating 57 and the cover 12b, and its lit and unlit states accompanying a main switch 64 being turned on or off can be visually identified from outside the lid 12.

Figure 13:
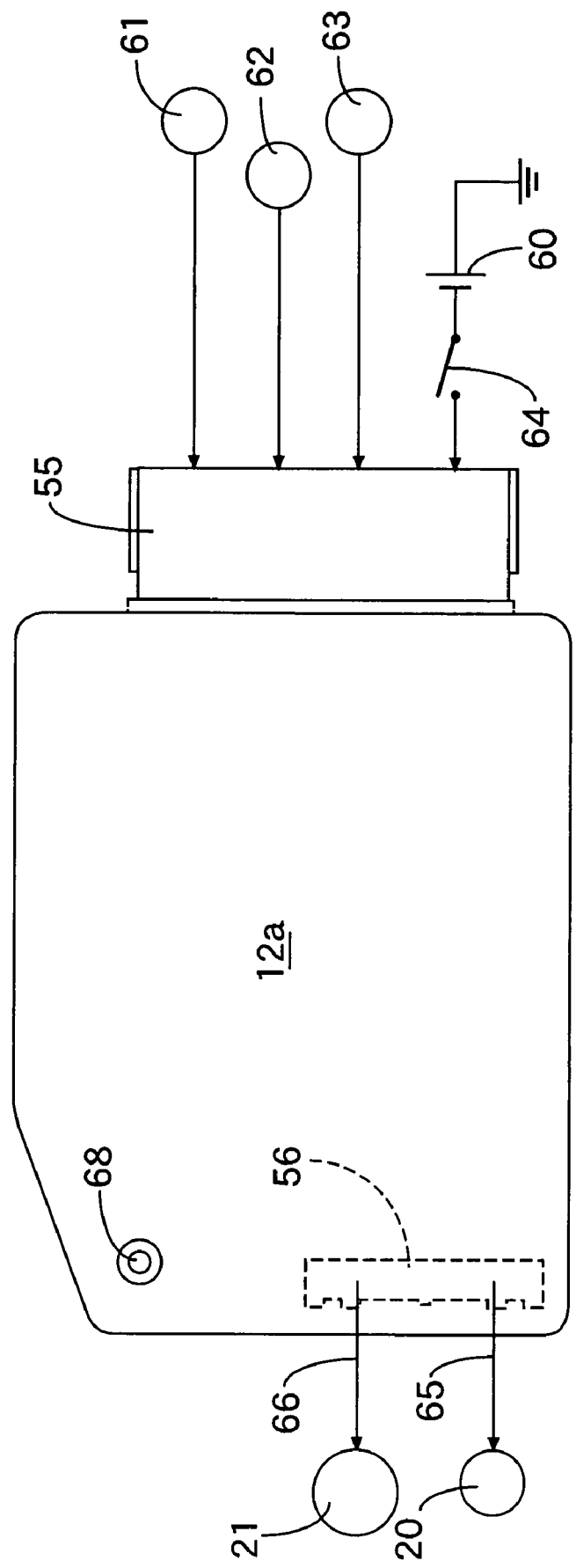
FIG. 13 is a plan view of an electronic control unit (first embodiment).

In FIG. 13, electric power of the battery 60, an output signal of a rotational speed setting device 61 that sets a desired rotational speed for the engine E, an output signal of a rotational speed sensor 62 for detecting the rotational speed of the engine E, an output signal of a temperature sensor 63 for detecting a temperature of the engine E, etc., are input via the input connector 55 into the electronic control unit 12a. The main switch 64 is provided on an energizing circuit between the battery 60 and the input connector 55.

Connected to the output connector 56 is an internal connector 67 (see FIG. 6), which is connected to wire harnesses 65 and 66 for energization of the first and second electric motors 20 and 21.

The operation of this embodiment is now described.

In the electronic control unit 12a, when the main switch 64 is switched on, the first electric motor 20 is operated by the power of the battery 60 based on the output signal of the temperature sensor 63, and the choke valve 7 is operated via the first transmission device 24 to a start opening-degree according to the engine temperature at that time. For example, when the engine E is cold, the choke valve 7 is driven to a fully closed position as shown in FIG. 9; and when the engine E is hot, the choke valve 7 is maintained at a fully opened position as shown in FIG. 10. Since the start opening-degree of the choke valve 7 is controlled in this way, by subsequently operating the recoil starter 5 for cranking in order to start the engine E, an air-fuel mixture having a concentration suitable for starting the engine at that time is formed in the intake path 6 of the carburetor C, thus always starting the engine E easily.

Immediately after starting the engine in a cold state, an excessive intake negative pressure of the engine E acts on the choke valve 7 which is in a fully closed state. As a result, as described above, since the choke valve 7 is automatically opened (see FIG. 11), regardless of operation of the first electric motor 20, until the difference between the rotational moment due to the intake negative pressure acting on the side of the choke valve 7 having a large rotational radius and the rotational moment due to the intake negative pressure acting on the side of the choke valve 7 having a small rotational radius balances the rotational moment due to the relief spring 31, the excessive intake negative pressure can be eliminated, thus preventing the air-fuel mixture from becoming too rich to ensure good warming-up conditions for the engine E.

Since the relief mechanism 33, which includes the relief lever 30 and the relief spring 31, is positioned so as to be offset from the top of the output shaft 20a of the first electric motor 20 and the top of the choke valve shaft 7a, the relief mechanism 33 is not superimposed on the output shaft 20a of the first electric motor 20 or the choke valve shaft 7a, and the transmission chamber 14 housing the first transmission device 24 can be made flat while providing the relief mechanism 33 in the first transmission device 24, thereby contributing to a reduction in the size of the casing 10.

When the engine temperature increases accompanying the progress of warming-up, the first electric motor 20 is operated based on the output signal of the temperature sensor 63 which changes according to the engine temperature, so that the choke valve 7 is gradually opened via the first transmission device 24. When the warming-up is completed, the choke valve 7 is put in a fully opened state (see FIG. 10), and this state is maintained during subsequent running.

On the other hand, the second electric motor 21 operates based on the output signals of the rotational speed setting device 61 and the rotational speed sensor 62, and controls opening and closing of the throttle valve 8 via the second transmission device 25 so that the engine rotational speed coincides with a desired rotational speed set by the rotational speed setting device 61, thus regulating the amount of air-fuel mixture supplied from the carburetor C to the engine E. That is, when an engine rotational speed detected by the rotational speed sensor 62 is lower than the desired rotational speed set by the rotational speed setting device 61, the degree of opening of the throttle valve 8 is increased, and when it is higher than the desired rotational speed, the degree of opening of the throttle valve 8 is decreased, thus automatically controlling the engine rotational speed to be the desired rotational speed regardless of a change in the load. It is therefore possible to drive various types of work machines by the motive power of the engine E at a stable speed regardless of a change in the load.

Running of the engine E can be stopped by switching the main switch 64 off and operating a kill switch (not illustrated) of the engine E. After completing a given operation, the engine E is usually in a hot state, and thus the choke valve 7 is maintained in a fully opened state by the first electric motor 20. Therefore, after running of the engine E is stopped, the fully opened state of the choke valve 7 is maintained. When the engine E is left in a cold region, an icing phenomenon often occurs, that is, water droplets condensed around the choke valve shaft 7a are frozen and the choke valve 7 becomes stuck. Such a phenomenon generally makes it difficult for the choke valve 7 to move to the fully closed state when the engine is started anew.

However, in the first transmission device 24, as described above, the structure coupling the relief lever 30 and the choke lever 32 to each other is arranged so that the lever ratio of the two levers 30 and 32 is a maximum when the choke valve 7 is in fully opened and fully closed positions, and a minimum when the choke valve 7 is at the predetermined medium opening-degree. Therefore, when the engine E is cold-started and the first electric motor 20 operates in a direction that closes the choke valve 7 based on the output signal of the temperature sensor 63, a maximum torque can be applied to the choke valve shaft 7a, thus crushing ice around the choke valve shaft 7a to reliably drive the choke valve 7 from the fully opened position to the fully closed position, whereby the reliability of an autochoke function is guaranteed without any problem in the cold starting.

Moreover, with the structure coupling the relief lever 30 and the choke lever 32 to each other, the torque acting on the choke valve shaft 7a from the first electric motor 20 can be made a maximum at least when the choke valve 7 is in the fully opened position. Therefore, an increase in the number of stages of reduction gears such as the first pinion 27 and the first sector gear 29 of the first transmission device 24 can be suppressed, thereby contributing to a reduction in the size of the first transmission device 24, and consequently reducing the volume of the transmission chamber 14 and the size of the casing 10. Furthermore, an unreasonable reduction ratio need not be given to the first pinion 27 and the first sector gear 29, and there are no concerns about degradation in the tooth base strength of the gears due to an excessive reduction in the module thereof.

During cold starting, if the amount of electricity stored in the battery 60 is insufficient, the first electric motor 20 does not operate, the choke valve 7 remains open as shown in FIG. 12(A), and when starting, a rich air-fuel mixture suitable for cold starting cannot be generated in the intake path 6. In such a case, as shown in FIG. 12(B), the operating lever 39 of the choke valve forced closure mechanism 37 is held and pivoted against the urging force of the return spring 41. As a result, the actuating arm 40, which is coupled to the operating lever 39 and faces the abutment piece 30a of the relief lever 30, pushes the abutment piece 30a, and this pushing force is transmitted from the relief lever 30 to the choke lever 32 so as to close the choke valve 7 to the fully closed position; if the engine E is started in this operating state, a rich air-fuel mixture suitable for cold starting can be generated in the intake path 6, thus reliably carrying out cold starting.

When the engine E starts, since the function of the battery 60 is recovered due to the operation of a generator generally provided in the engine E, or the generator directly supplies electricity to the electronic control unit 12a, the first electric motor 20 operates normally, the choke valve 7 is controlled to an appropriate warm-up opening-degree, and it is therefore necessary to return the actuating arm 40 to a non-operating position retracted from the relief lever 30 so as not to interfere with the operation of the first electric motor 20.

Then, if the hand is released from the operating lever 39, the operating lever 39 and the actuating arm 40 is automatically returned to the non-operating position by virtue of the urging force of the return spring 41, thereby preventing any increase in the load on the first electric motor 20 caused by the operating lever 39 being erroneously left unreturned.

The actuating arm 40 can push the abutment piece 30a of the relief lever 30 only in a direction that closes the choke valve 7, and when it is held at the retracted position by a set load of the return spring 41, it merely faces the abutment piece 30a of the relief lever 30 and is put in a state in which it is detached from the first transmission device 24. Therefore, when the choke valve 7 is driven normally by the first electric motor 20, the choke valve forced closure mechanism 37 does not impose any load on the first transmission device 24, thereby preventing malfunction of or damage to the first transmission device 24.

In such an electronic control system D, the gap 70 opening to the atmosphere via the air passage 72 is provided between the electronic control unit 12a and the cover 12b which form the lid body 12 of the casing 10. Therefore, when air between the electronic control unit 12a and the cover 12b expands or contracts due to heat generation or heat dissipation from the electronic control unit 12a, or heating or cooling of the cover 12b caused by a change in temperature of the engine E, the gap 70 breathes to prevent an excessive pressure from acting on the electronic control unit 12a, and also prevent dew condensation on the electronic control unit 12a. As a result, the durability of the electronic control unit 12a can be enhanced.

The air passage 72 for ensuring the breathing by the gap 70 extends from the gap 70 in a hook shape, and has its outer end facing downward so as to open to the atmosphere. Therefore, it is difficult for rainwater or the like to enter the gap 70 via the air passage 72. Even if rainwater or the like enters the gap 70, it can easily be discharged from the air passage 72.

Further, since the gap 70 is defined between the cover 12b and the electronic control unit 12a by forming the bulging part 71 which causes its portion other than its peripheral portion to bulge outwardly on the cover 12b, the gap 70 having a uniform thickness can easily be obtained while stabilizing support of the electronic control unit 12a by the cover 12b. Therefore, the increase in dimensions of the system due to the gap 70 is negligible.

Furthermore, the vent 74 or 74' for providing communication between the base part of the casing main body 11 and the intake path 6 is provided in the upper side wall of the carburetor C. Therefore, the interior of the casing 10 can breathe through the vent 74 or 74', when the air within the casing 10 expands or contracts due to heat generation or heat dissipation from the first and second electric motors 20 and 21 of the electronic control unit 12a, or heating or cooling of the casing 10 caused by a change in temperature of the engine E, thereby preventing an excessive pressure from acting on the electronic control unit 12a and the first and second electric motors 20 and 21. Moreover, the breathing can also prevent dew condensation on the electronic control unit 12a and the first and second electric motors 20 and 21, resulting in improvement of the durability of the electronic control unit 12a and the first and second electric motors 20 and 21. Since the intake negative pressure generated in the intake path 6 is transmitted to the interior of the casing 10 via the vent 74 or 74' when the engine E is running, even if water droplets generated due to dew condensation accumulate in the base part of the casing 10, they can be drawn out to the intake path 6.

As described above, since there is no fear of sucking in outside dirt when the interior of the casing 10 breathes, the vent 74 or 74' is advantageously open to the intake path 6 rather than to the outside air. Further, with the use of a structure such that the vent 74 opens to the intake path 6 via the bearing hole 77 of the choke valve shaft 7a, even if the vent 74 has a large diameter, its open end is constricted between the inner periphery of the bearing hole 77 and the outer periphery of the choke valve shaft 7a fitted into the bearing hole 77. Therefore, it is possible to easily prevent fuel contained in some amount in blow-back gas from entering the vent 74 when the engine E blows back, and it is thus relatively easy to bore the large diameter vent 74.

Further, the large electronic components 51 to 53 of the electronic control unit 12a are disposed in the proximity of the partition plate 16 on one side part of the drive chamber 15, the low-profile electronic component 54 is disposed on the other side part of the drive chamber 15, and the first and second electric motors 20 and 21 are disposed on said other side part of the drive chamber 15 so as to be in the proximity of the printed wiring board 50 and the low-profile electronic component 54. Therefore, the first and second electric motors 20 and 21 are disposed in a staggered manner relative to the large electronic components 51 to 53, thereby efficiently housing the first and second electric motors 20 and 21 and the large electronic components 51 to 53 in the drive chamber 15. Thus, it is possible to greatly reduce the dead space in the drive chamber 15, the capacity of the drive chamber 15, the dimensions of the casing 10, and consequently the size of the entire engine E including the carburetor C equipped with the electronic control system D.

Furthermore, in order to seal the printed wiring board 50 on which various types of electronic components 51 to 54 are mounted, the synthetic resin coating 57 for covering them is formed so as to have a substantially uniform thickness along the shapes of the printed wiring board 50 and the various types of electronic components 51 to 54, providing no wasteful thick part. Therefore, the staggered arrangement of the first and second electric motors 20 and 21 and the large electronic components 51 to 53 is not hindered, thus contributing to downsizing of the casing 10.

Figure 17:
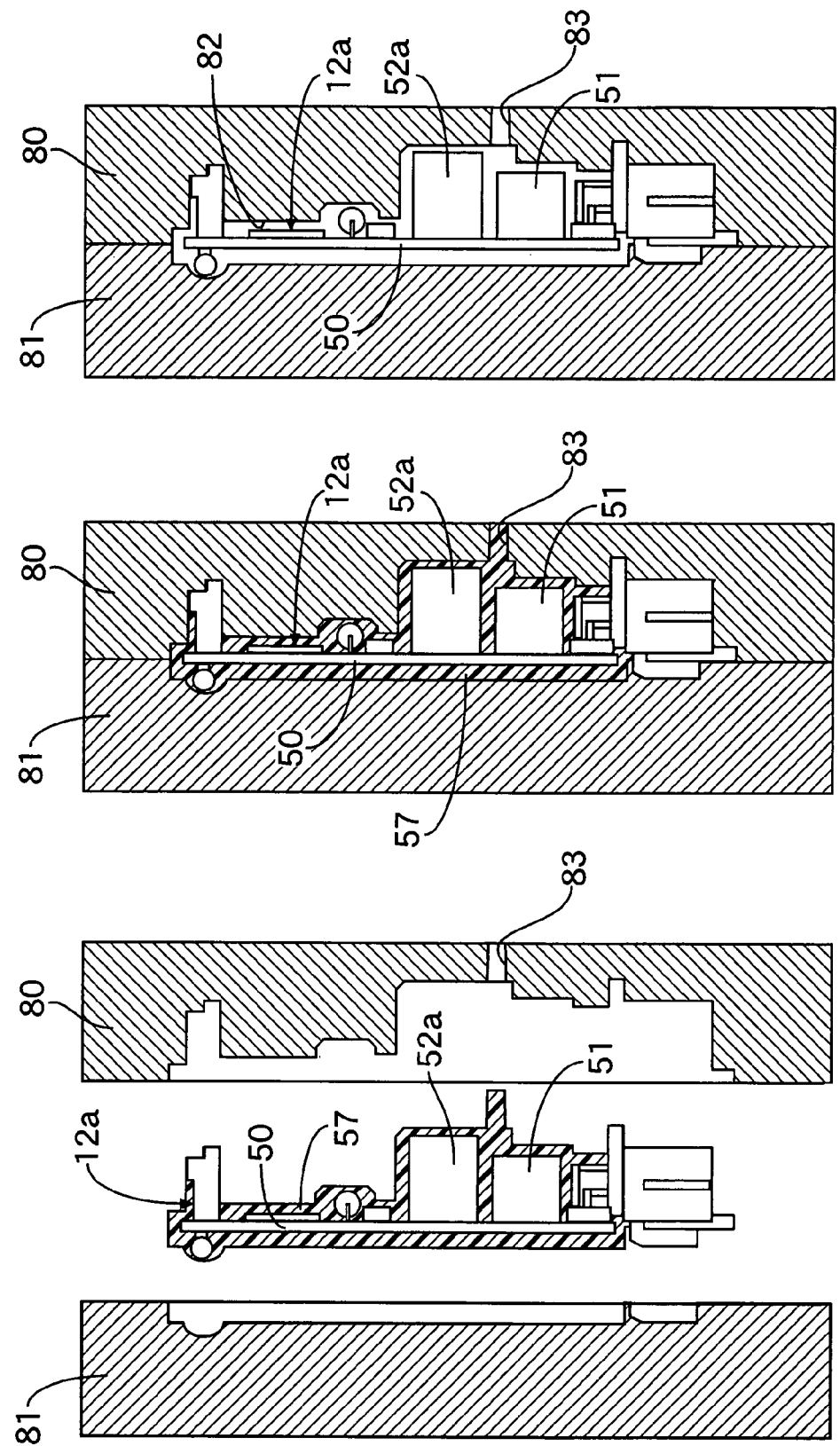
FIG. 17 is a diagram for explaining a method for forming a coating on the electronic control unit (first embodiment).

A process of forming the coating 57 is described here by reference to FIG. 17.

Figure 16:
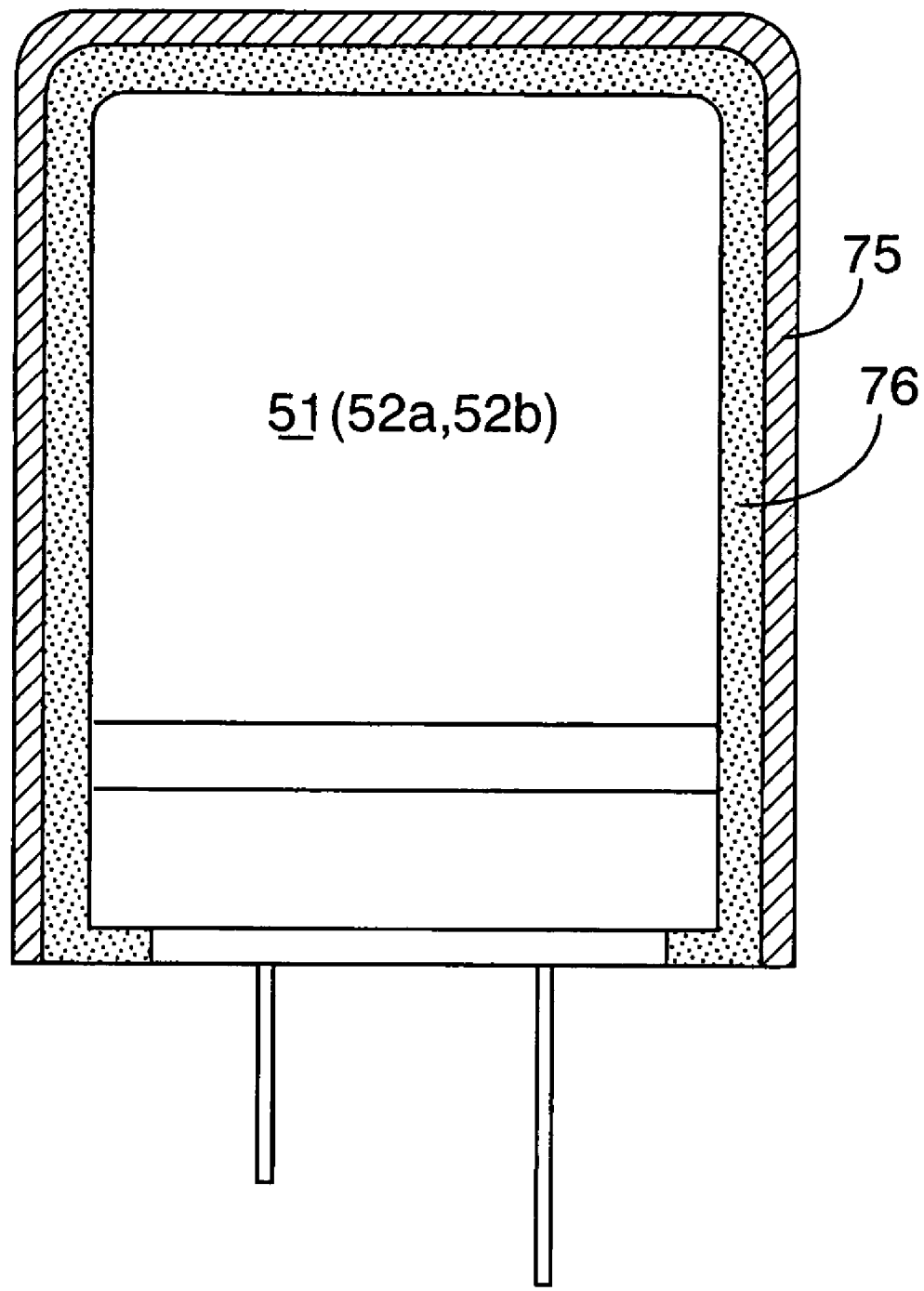
FIG. 16 is a sectional side view of an essential part of a large electronic component that has been subjected to a pressure resistance treatment (first embodiment).

A hot melt molding method is employed for formation of the coating 57. Prior to the hot melt molding, the tall large electronic components 51 to 53 such as a capacitor are subjected to a pressure resistance treatment in advance, as shown in FIG. 16. Specifically, each of the large electronic components 51 to 53 is housed in a protective case 75 made of a pressure resistant resin, for example a glass fiber-filled resin; and the interior of the protective case 75 is filled by potting with a heat resistant synthetic resin 76, for example a thermosetting epoxy resin in order to fill the gap around each of the large electronic components 51 to 53, thus making the interior of the protective case 75 solid. Each of the large electronic components 51 to 53 subjected to the pressure resistance treatment as described above is mounted on the printed wiring board 50 in advance.

When forming the coating 57 by hot melt molding, a fixed die half 80 and a movable die half 81 which can open and close relative to each other are prepared in the first place, as shown in FIG. 17(A); the movable die half 81 is opened, and the printed wiring board 50 on which the various types of electronic components 51 to 54 are mounted is placed at a fixed position between the two die halves 80 and 81; and the movable die half 81 is then closed relative to the fixed die half 80. In this process, a cavity 82 having a uniform gap is formed between the two die halves 80 and 81, and the printed wiring board 50 and the various types of electronic components 51 to 54.

As shown in FIG. 17(B), by injecting a heated molten hot melt from a gate 83 of the fixed die half 80 so as to fill the cavity 82 with the hot melt, the coating 57 formed from the hot melt and having a uniform thickness can be formed on the surfaces of the printed wiring board 50 and the various types of electronic components 51 to 54.

When the holt melt injected so as to fill the cavity 82 is cooled by the two die halves 80 and 81 to be solidified as shown in FIG. 17(C), the movable die half 81 is opened, and the electronic control unit 12a equipped with the coating 57 is removed from between the two die halves 80 and 81.

When injecting the hot melt into the cavity 82 so as to fill it, the injection pressure acts on the large electronic components 51 to 53 having a particularly large height. However, as described above, each of the large electronic components 51 to 53 is covered with the pressure resistant protective case 75 and is protected so that it is not exposed directly to the injection pressure and heat, thus preventing the large electronic components 51 to 53 from being damaged by the injection pressure and heat.

In particular, since the gap between each of the large electronic components 51 to 53 and the protective case 75 is filled with the heat resistant synthetic resin 76 so that the interior of the protective case 75 becomes solid, the rigidity of the protective case 75 is increased. Therefore, the large electronic components 51 to 53 can be protected even by employing the relatively thin protective case 75.

Also, if the protective case 75 is made of a synthetic resin containing glass fiber, the protective case 75 can be made light and highly rigid, thereby further enhancing the function of protecting the large electronic components 51 to 53.

Further, since the hot melt has a relatively low melting temperature and a high flowability, the influence of the injection pressure and heat on the protective case 75 can be reduced, and this is also effective for protecting the large electronic components 51 to 53.

Furthermore, since the coating 57 formed on the printed wiring board 50 and the various types of electronic components 51 to 54 has a uniform thickness, the entire coating 57 can be cooled uniformly, and this can prevent the printed wiring board 50 and other components from being distorted.

Moreover, among the various types of electronic components 51 to 54 mounted on the printed wiring board 50, the electronic components that are housed in the protective case 75 are limited to the large electronic components 51 to 53, which have a particularly large height. This is because, the small electronic component 54 having a small height is resistant to the influence of the pressure and heat of injection molding of the coating 57 even without being housed in the protective case 75, leading to no possibility of damage thereof. Therefore, this can contribute to a reduction in the cost of the electronic control unit by an amount corresponding to a part of the protective case 75 that would otherwise have been used for the small electronic component 54.

Thus, it is possible to provide an inexpensive electronic control unit that always has stable performance.

Finally, a modified example of the air passage structure within the casing 10 is described by reference to FIG. 19 and FIG. 20.

A flange part 84 formed on an end part of the carburetor C on the upstream side is fixed by a connecting bolt 86 and connected, together with an intake duct 91 communicating with an air cleaner (not illustrated), to the cylinder head 3a of the engine E via an annular insulator 85. The intake path 6 of the carburetor C communicates with an intake port 87 of the cylinder head 3a via a hollow part of the insulator 85. In this arrangement, gaskets 88 are disposed between the insulator 85, and the flange part 84 and the cylinder head 3a.

A labyrinth 89 having its outer end facing downward so as to open to the atmosphere is formed on the flange part 84 and one opposing face of the insulator 85 (an end face on the flange part 84 side in the illustrated example). A vent 90 providing communication between the labyrinth and the base part of the interior of the casing 10 is provided in an upper side wall of the carburetor C.

In this way, since the interior of the casing 10 communicates with the atmosphere via the vent 90 and the labyrinth 89, the interior of the casing 10 can breathe therethrough. Further, the labyrinth 89 having the opened outer end facing downward does not easily allow rainwater or dirt to enter. Even if the rainwater or dirt enters, it naturally flows down to be discharged to the outside.

Figure 19:
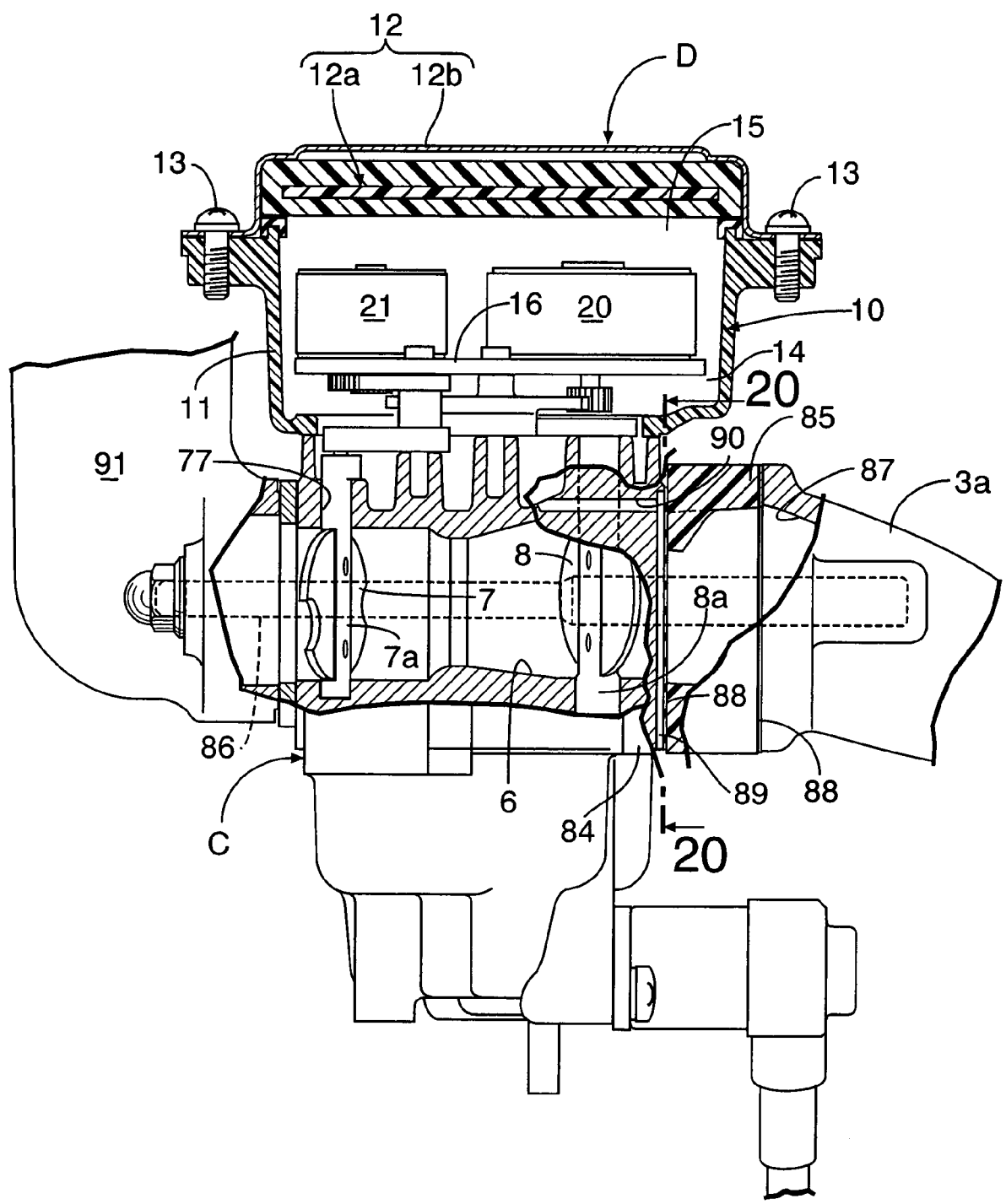
FIG. 19 is a view, corresponding to FIG. 18, showing a modified example of an air passage structure within a casing (first embodiment).
Figure 20:
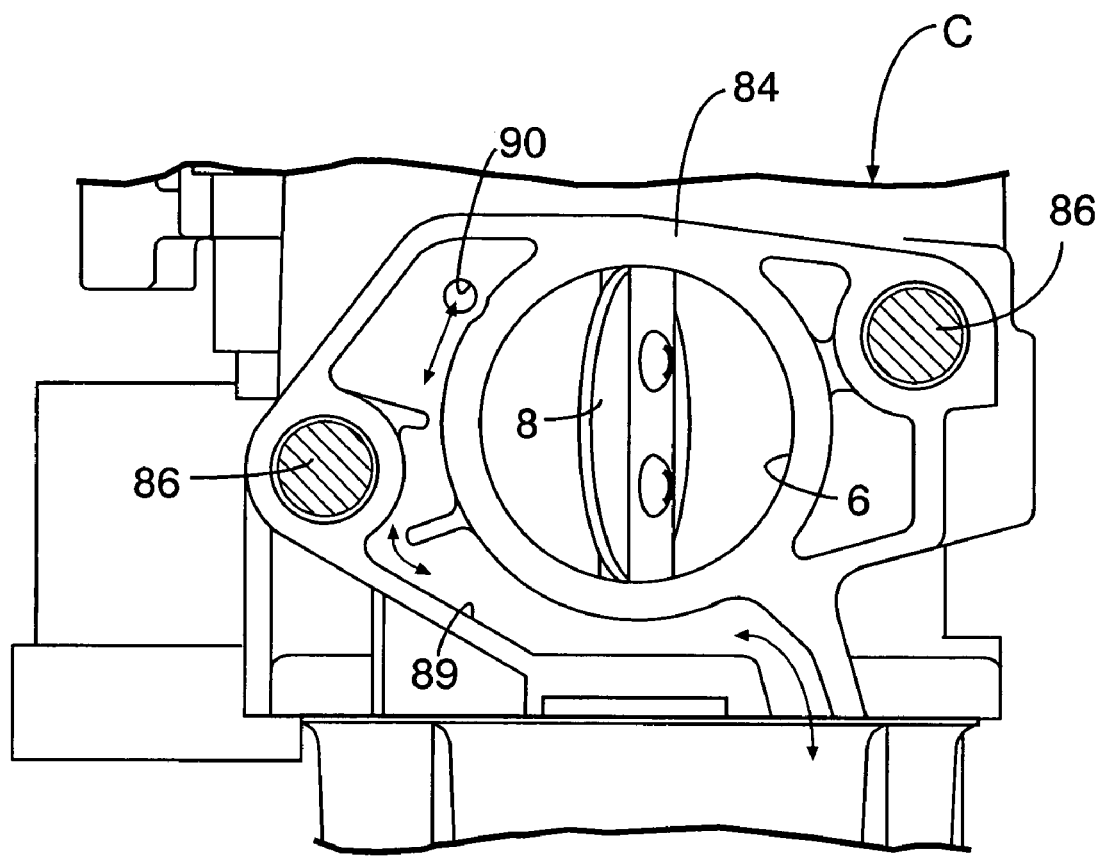
FIG. 20 is a sectional view along line 20-20 in FIG. 19 (first embodiment).

Since the other components are the same as those of the Embodiment 1, components in FIG. 19 and FIG. 20 corresponding to those of Embodiment 1 are denoted by the same reference numerals and symbols, and description thereof is omitted.

The present invention is not limited to the above-mentioned embodiment and can be modified in a variety of ways without departing from the spirit and scope of the present invention.

The invention claimed is:

1. An electronic control unit comprising:
   a printed wiring board,
   electronic components mounted on the printed wiring board, and a synthetic resin coating formed by injection molding to cover the printed wiring board and the electronic components,
   wherein one electronic component having a height that is larger relative to a height of the other electronic components is housed in a protective case configured to resist pressure and heat during the injection molding of the coating, wherein a gap defined between the one electronic component having the larger height and an interior of the protective case is filled with a heat resistant synthetic resin.

2. A process of producing the electronic control unit according to claim 1, the process comprising:
   a step of mounting on the printed wiring board the one electronic component which is housed and held in the protective case; and
   a step of molding the coating by setting within a die the printed wiring board on which the one electronic component is mounted, injecting a hot melt into a cavity having a uniform gap defined by the die around the printed wiring board and the one electronic component, and filling the cavity with the hot melt.

3. The process according to claim 2, further comprising:
   a step of, before mounting the one electronic component on the printed wiring board, filling by potting the heat resistant synthetic resin into the gap around the one electronic component to make the interior of the protective case solid.

4. The electronic control unit according to claim 1, wherein the one electronic component is mounted directly onto an inner face of the printed wiring board, the inner face opposing a drive chamber.

5. The electronic control unit according to claim 1, wherein the synthetic resin coating directly contacts and further covers an outer face of the printed wiring board, the outer face being defined on a surface that is opposite to a surface on which the inner face is defined.

6. The electronic control unit according to claim 1, wherein the other electronic components are directly mounted on the inner face of the printed wiring board.

* * * * *